United States Patent
Fairbairn et al.

[19]

[11] Patent Number: 6,152,070
[45] Date of Patent: *Nov. 28, 2000

[54] TANDEM PROCESS CHAMBER

[75] Inventors: Kevin Fairbairn, Saratoga; Jessica Barzilai, Mountain View; Hari K. Ponnekanti, Santa Clara; W. N. (Nick) Taylor, Dublin, all of Calif.

[73] Assignee: Applied Materials, Inc., Santa Clara, Calif.

[*] Notice: This patent is subject to a terminal disclaimer.

[21] Appl. No.: 08/751,524

[22] Filed: Nov. 18, 1996

[51] Int. Cl.[7] .................................................. C23C 16/00
[52] U.S. Cl. .................................... 118/719; 118/723 MP
[58] Field of Search ...................... 156/345; 118/723 MP, 118/719

[56] References Cited

U.S. PATENT DOCUMENTS

| | | |
|---|---|---|
| 4,785,962 | 11/1988 | Toshima . |
| 4,819,167 | 4/1989 | Cheng et al. . |
| 5,120,019 | 6/1992 | Davis, Jr. . |
| 5,133,284 | 7/1992 | Thomas et al. . |
| 5,226,632 | 7/1993 | Tepman et al. . |
| 5,275,303 | 1/1994 | Szalai . |
| 5,292,393 | 3/1994 | Maydan et al. . |
| 5,302,209 | 4/1994 | Maeda et al. . |
| 5,363,872 | 11/1994 | Lorimer . |
| 5,469,035 | 11/1995 | Lowrance . |
| 5,494,494 | 2/1996 | Mizuno et al. . |
| 5,505,779 | 4/1996 | Mizuno et al. . |
| 5,525,160 | 6/1996 | Tanaka et al. ............................ 118/728 |
| 5,611,861 | 3/1997 | Higashi ................................... 118/719 |
| 5,798,016 | 8/1998 | Oehrlein ................................. 156/345 |
| 5,885,356 | 3/1999 | Zhao et al. ........................ 118/723 ER |

FOREIGN PATENT DOCUMENTS

| | | | |
|---|---|---|---|
| 0 246 453 A2 | 11/1987 | European Pat. Off. | ......... H01J 37/18 |
| 0 342 279 A1 | 11/1989 | European Pat. Off. | ......... H01J 37/32 |
| 44 12 915 A1 | 11/1994 | Germany | ......... H01J 37/32 |
| 63230880 | 9/1988 | Japan | ............. C23C 16/50 |

OTHER PUBLICATIONS

Z. Shiller and S. Dubowski, "Robot Path Planning with obstacles, Actuator, Gripper, and Payload Constraints," International Journal of Robotics Research, vol. 8, No. 6, Dec. 1989, pp. 3–18.

Z. Shiller and H. H. Lu, "Computation of Path Constrained Time Optimal Motions With Dynamic Singularities," Transactions of the ASME, Journal of Dynamic Systems, Measurement, and Control, vol. 114, Mar. 1992, pp. 34–40.

Mattson Brochure

U.S. application No. 08/751,485, Mayden et al., filed Nov. 18,1996.

U.S. application No. 08/752,463, Altwood et al., filed Nov. 18,1996

U.S. application No. 08/752,471, Fairbairn et al., filed Nov. 18, 1996.

U.S. application No. 08/749,614, Sunder, filed Nov. 18, 1996.

U.S. application No. 08/749,612, Fairbairn et al., filed Nov. 18, 1996.

U.S. application No. 08/749,611, Blum et al., filed Nov. 18, 1996.

U.S. application No. 08/752,462, Lane et al., filed Nov. 18, 1996.

U.S. application No. 08/749,613, Fairbairn et al., filed Nov. 18, 1996.

U.S. application No. 08/751,484, Fairbairn et al., filed Nov. 18, 1996.

U.S. application No. 08/751,486, Fairbairn et al., filed Nov. 18, 1996.

U.S. application No. 08/746,859, Kroeker, filed Nov. 18, 1996.

EP Search Report dated Jan. 5, 1999.

Abstract of JP 60098628 dated Jun. 1,1985.

*Primary Examiner*—Richard Bueker
*Assistant Examiner*—Erin Fieler
*Attorney, Agent, or Firm*—Thomason, Moser & Patterson

[57] ABSTRACT

The present invention provides an apparatus for vacuum processing generally comprising an enclosure having a plurality of isolated chambers formed therein, a gas distribution assembly disposed in each processing chamber, a gas source connected to the plurality of isolated chambers, and a power supply connected to each gas distribution assembly.

29 Claims, 29 Drawing Sheets

TANDEM PROCESS CHAMBER

FIELD OF THE INVENTION

The present invention relates to a method and apparatus, including a system and individual system components, for concurrent processing of multiple wafers in the fabrication of integrated circuits. More particularly, the present invention provides a staged vacuum system having one or more process chambers which share one or more utilities, one or more loadlock chambers and a transfer chamber connected to both the loadlock chambers and the process chambers.

BACKGROUND OF THE RELATED ART

The term "cluster tool" generally refers to a modular, multichamber, integrated processing system having a central wafer handling module and a number of peripheral process chambers. Cluster tools have become generally accepted as effective and efficient equipment for manufacturing advanced microelectronic devices. Wafers are introduced into a cluster tool where they undergo a series of process steps sequentially in various process chambers to form integrated circuits. The transfer of the wafers between the process chambers is typically managed by a wafer handling module located in a central transfer region. Typically, cluster tools are of two different types: single wafer processing or batch wafer processing. Single wafer processing generally refers to a chamber configuration in which a single wafer is located for processing. Batch wafer processing generally refers to a chamber configuration in which multiple wafers are positioned on a turntable and are processed at various positions within the chamber as the turntable rotates through 360°. A cluster tool configured for batch processing allows multiple wafers, typically from four (4) to seven (7) wafers, to be simultaneously processed in a single chamber.

FIGS. 1 and 2 show examples of commercially available batch processing systems 10. FIG. 1 is a top schematic view of a radial cluster tool for batch processing that is available from Novellus Corporation. This cluster tool includes two batch processing chambers 12, 13 that each hold six wafers 14 for processing. A single wafer handling robot 16 located in a transfer chamber 18 is used to transfer wafers from a loadlock chamber 20 to a first batch processing chamber 12 one by one, where the wafers are sequentially received on a turntable 22 before receiving the same processing steps. The wafers may then be transferred, one by one, to a second batch processing chamber 13, where the wafers undergo additional processing steps. Typically, wafers are loaded into the system one at a time and moved into a chamber where they receive partial processing at various positions as the wafers are rotated 360° on the turntable.

FIGS. 2A and 2B are top and side schematic views of a cluster tool 10 for batch processing that is available from Mattson Technology. The loadlock chamber 20 and transfer chamber 18 have a common wafer elevator 19 that allow the wafers to be staged within the transfer chamber. A transfer robot 16 transports wafers to the processing chamber, such as a chemical vapor deposition (CVD) chamber, which holds up to four wafers. The wafers are then returned to the wafer elevator and eventually withdrawn from the tool.

One disadvantage of batch processing, including the processing performed in the cluster tools described above, is that batch processing frequently provides poor deposition uniformity from the center of the wafer to the edge of the wafer. Process uniformity is important in order to obtain uniformity of deposition on the wafer. The poor uniformity of batch processing systems is a direct result of having multiple wafers being partially processed at multiple stations within a single chamber.

An alternative approach to improve process uniformity is the use of single wafer processing chambers. Single wafer processing is generally considered to provide a higher degree of control over process uniformity, because a single wafer is positioned in a process chamber where it undergoes a complete process step, such as a deposition step or an etch step, without having to be moved to a different position. Furthermore, the components of a single wafer processing chamber can be positioned concentrically or otherwise relative to the single wafer.

FIG. 3 shows a top schematic view of a cluster tool 10 having multiple single wafer processing chambers 12 mounted thereon. A cluster tool similar to that shown in FIG. 3 is available from Applied Materials, Inc. of Santa Clara, Calif. The tool includes a loadlock chamber 20 and a transfer chamber 18 having a wafer handling module 16 for moving the wafers from location to location within the system, in particular, between the multiple single wafer processing chambers 12. This particular tool is shown to accommodate up to four (4) single wafer processing chambers 12 positioned radially about the transfer chamber.

There is a need for a vacuum processing system that provides both uniform wafer processing and high throughput. More particularly, there is a need for an integrated system and process chambers that work in cooperation to incorporate single wafer architecture with batch wafer handling techniques. It would be desirable to have a system with a small footprint/faceprint and which requires lower capital investments and operating costs than typical cluster tools.

SUMMARY OF THE INVENTION

The present invention provides an apparatus for vacuum processing generally comprising an enclosure having a plurality of isolated chambers formed therein, a gas distribution assembly disposed in each processing chamber, a gas source connected to the isolated chambers, and a power supply connected to each gas distribution assembly. The chambers also preferably include a remote plasma system for generation of excited cleaning gases and delivery of these gases into the chamber. The chambers within an enclosure preferably share process gases and an exhaust system, but includes separate power sources connected to each gas distribution system.

In one aspect of the invention, the chambers are configured to provide concurrent processing of multiple wafers having shared gas supplies and a shared exhaust system. To facilitate chamber cleaning, a remote plasma system is disposed adjacent to the chambers to deliver reactive cleaning gases into the chambers.

In another aspect of the invention, the chambers provide independent temperature and power control to facilitate plasma process control within each chamber. Each gas distribution assembly preferably includes its own power supply and related power control. Each pedestal also preferably including a temperature controlled member and a temperature control.

BRIEF DESCRIPTION OF THE DRAWINGS

The above and other advantages of the present invention are described in conjunction with the following drawing figures, in which.

DETAILED DESCRIPTION OF THE INVENTION

Figure 1:
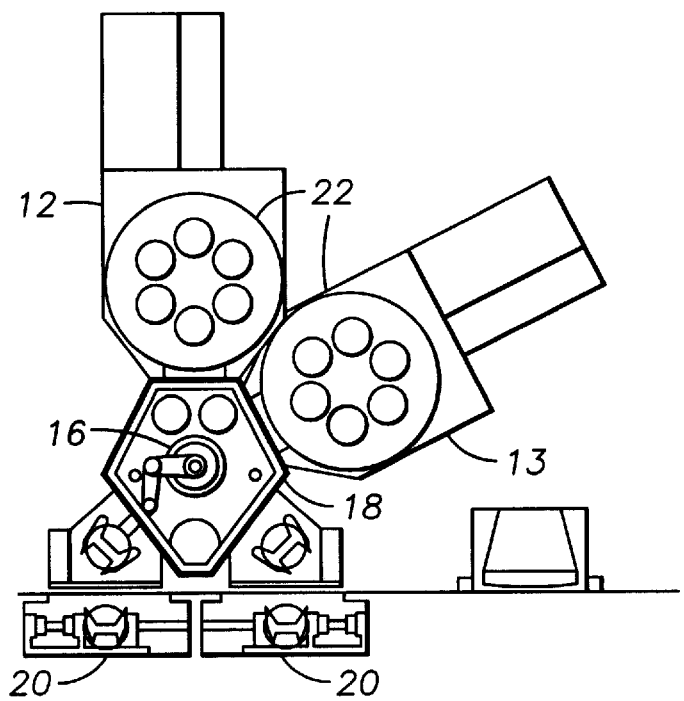
FIG. 1 is a top schematic view of a radial cluster tool for batch processing that is available from Novellus Corporation.
Figure 2A:
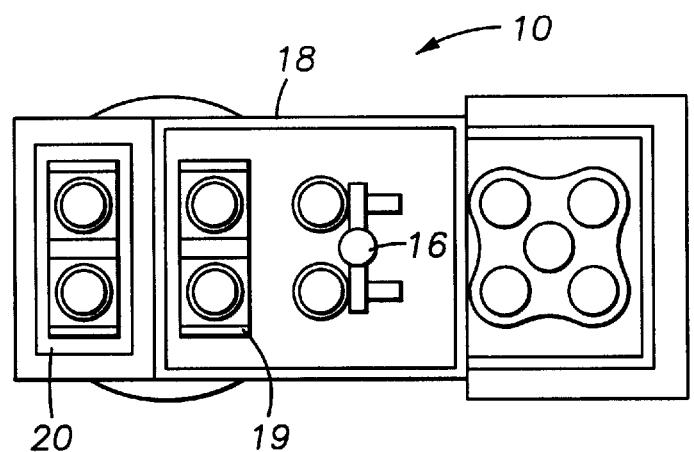
FIGS. 2A and 2B are top and side schematic views of a linear cluster tool for batch processing that is available from Mattson Technology.
Figure 2B:
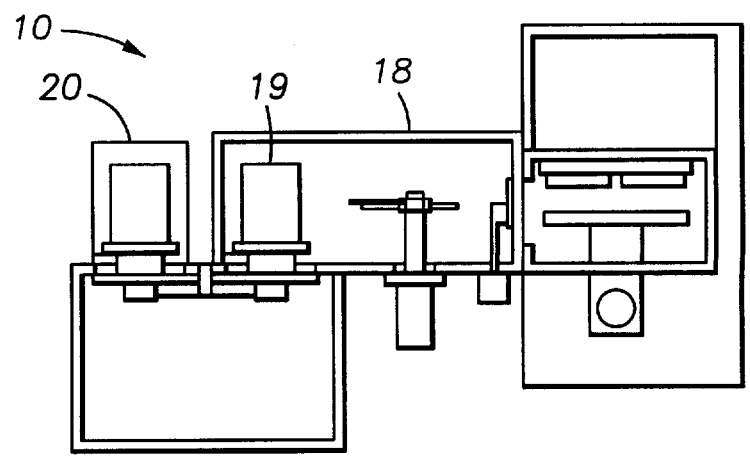
Figure 3:
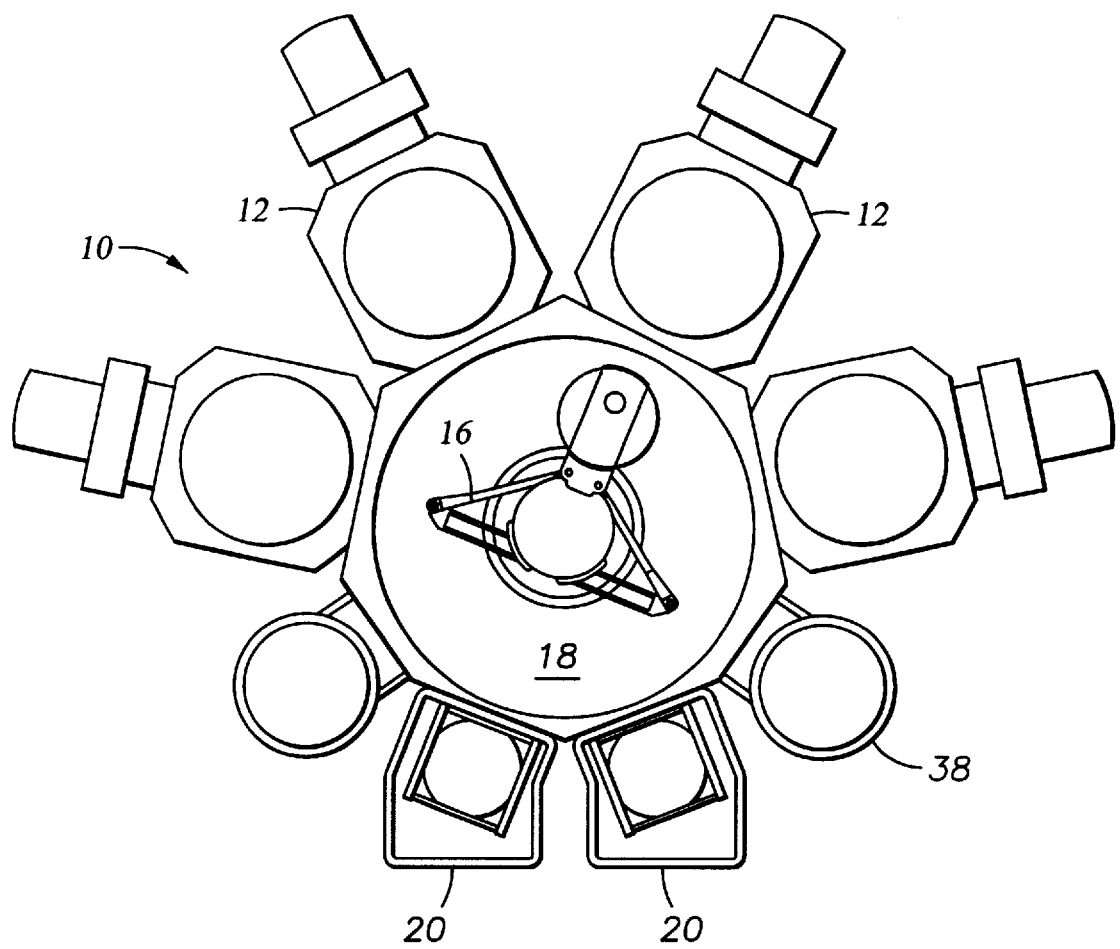
FIG. 3 is a top schematic view of a cluster tool having a plurality of single wafer processing chambers.
Figure 4:
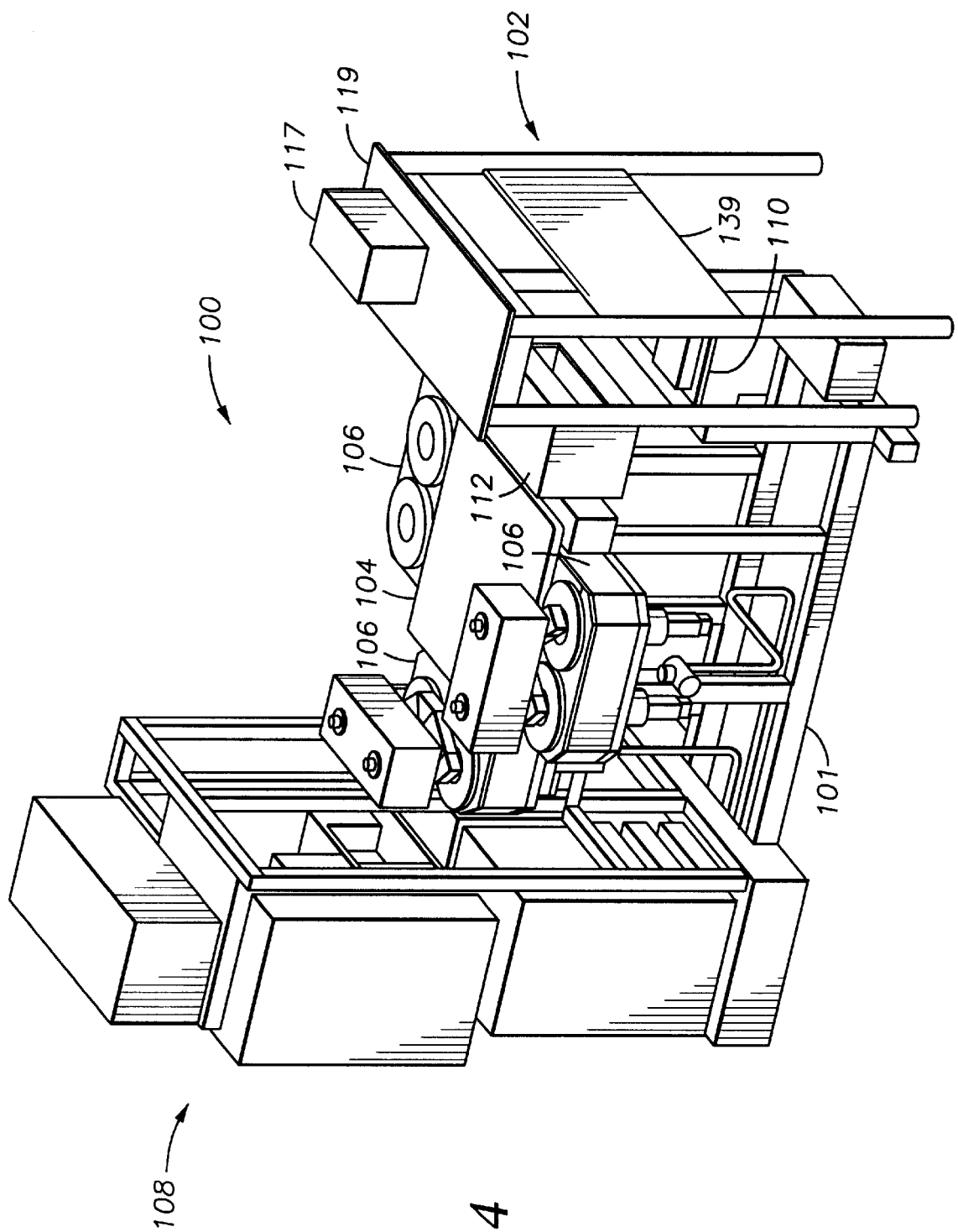
FIG. 4 is a perspective view of one embodiment of the vacuum processing system of the present invention.
Figure 5:
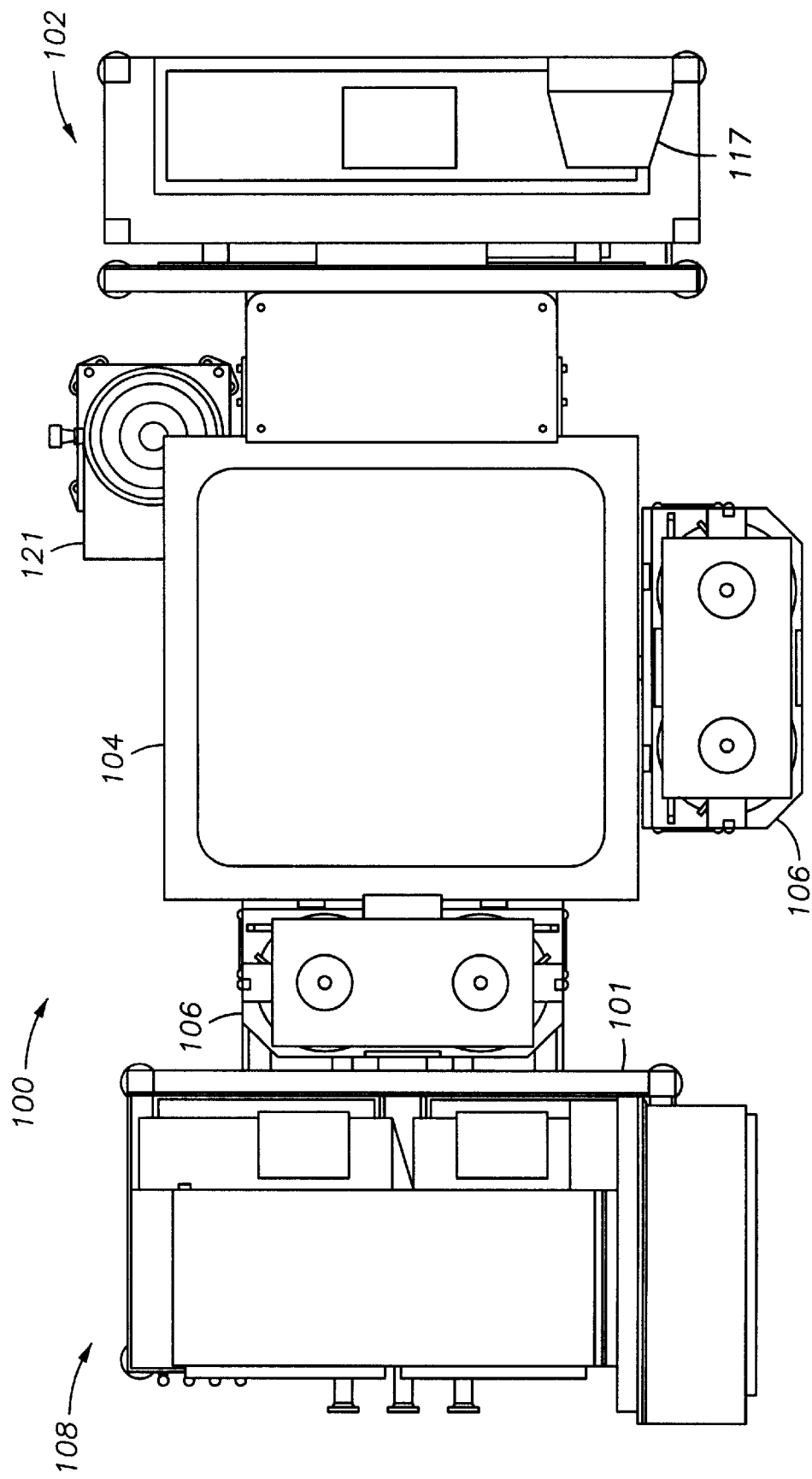
FIG. 5 is a top schematic view of one embodiment of the vacuum processing system of the present invention.
Figure 6:
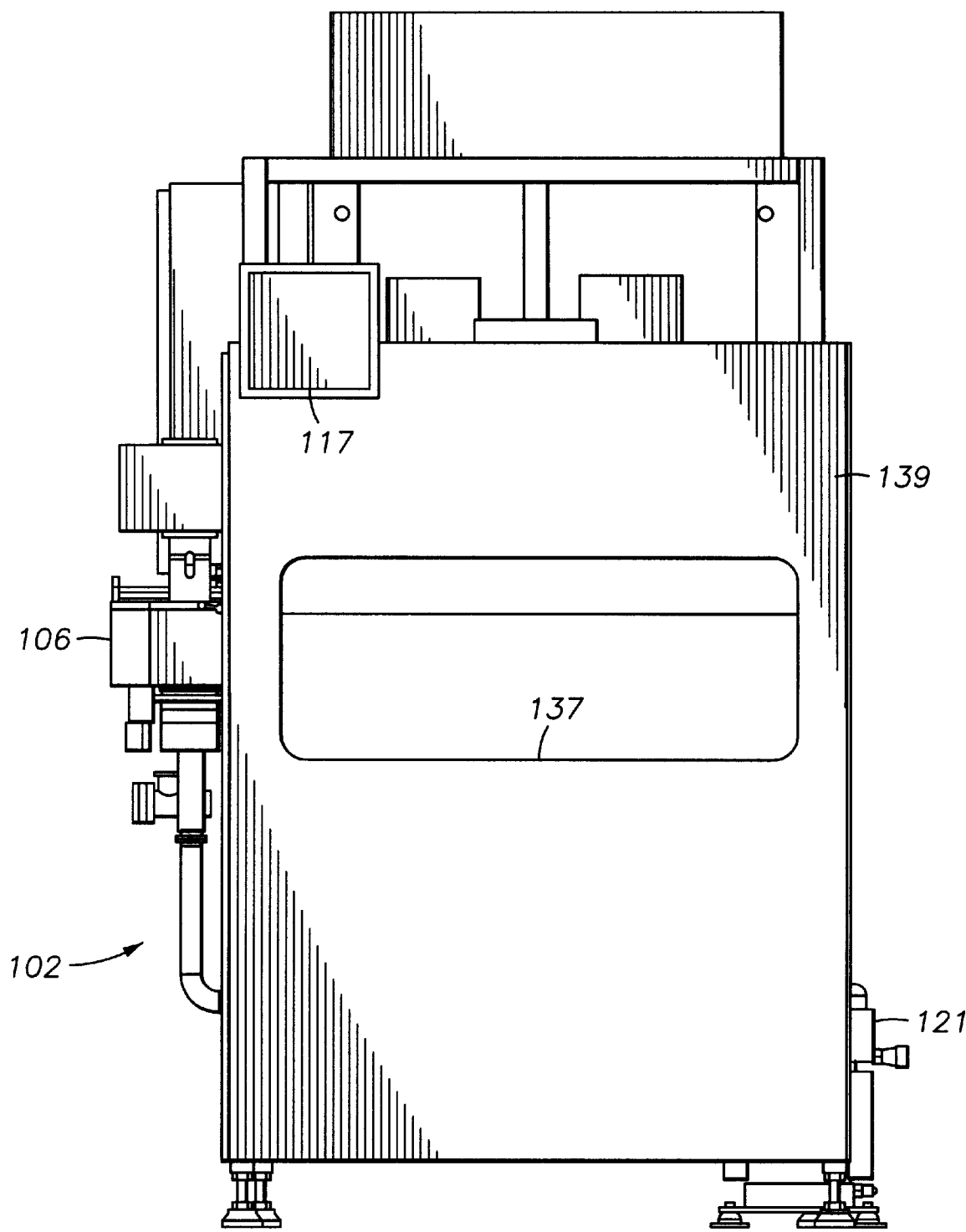
FIG. 6 is a front end view of one embodiment of the vacuum processing system of the present invention.
Figure 7:
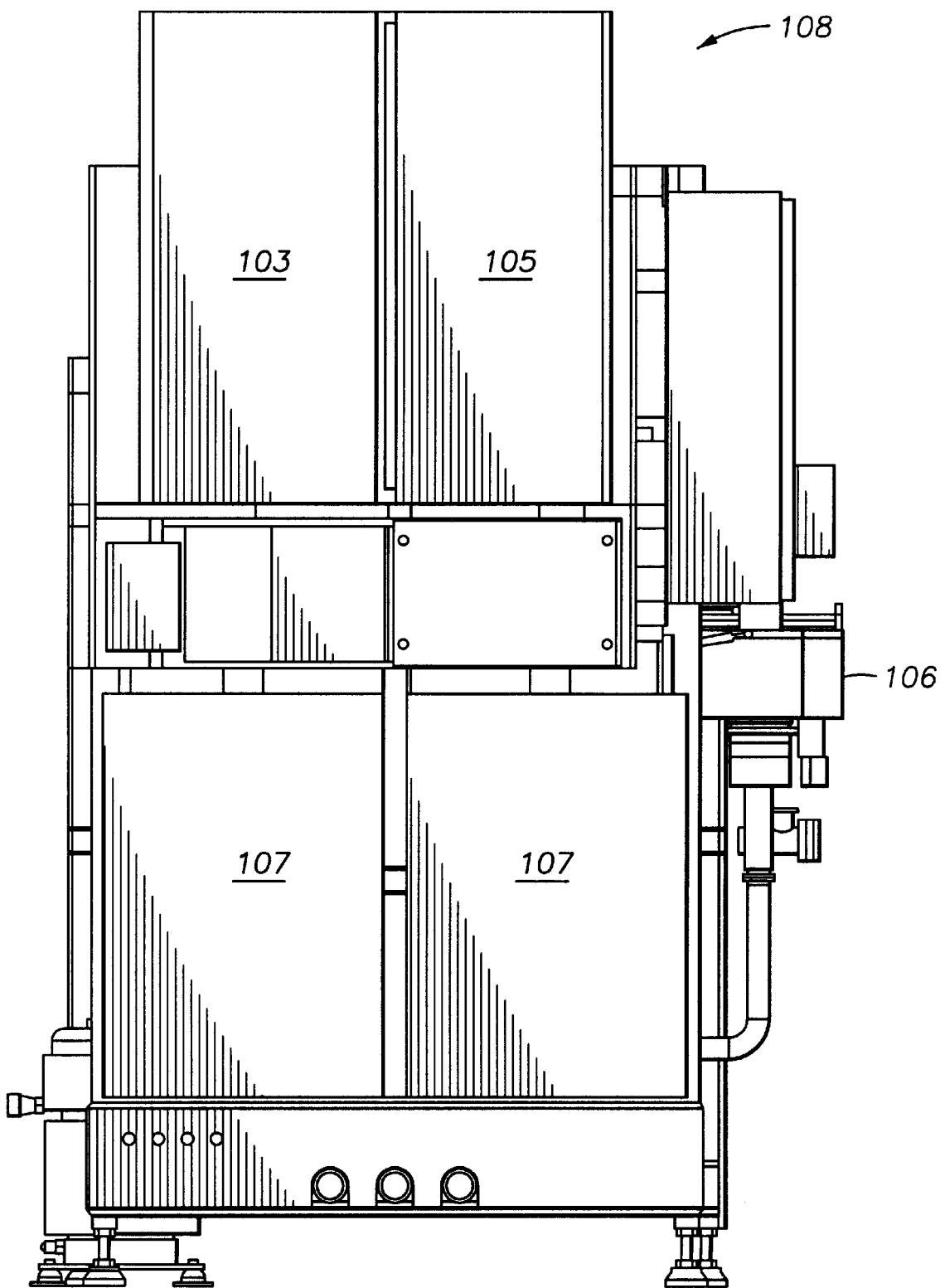
FIG. 7 is a back end view of one embodiment of the vacuum processing system of the present invention.

The present invention generally provides a cassette-to-cassette vacuum processing system which concurrently processes multiple wafers and combines the advantages of single wafer process chambers and multiple wafer handling for high quality wafer processing, high wafer throughput and reduced system footprint. In accordance with one aspect of the invention, the system is preferably a staged vacuum system which generally includes a loadlock chamber for introducing wafers into the system and which also provides wafer cooling following processing, a transfer chamber for housing a wafer handler, and one or more processing chambers each having two or more processing regions which are isolatable from each other and preferably share a common gas supply and a common exhaust pump. Isolatable means that the processing regions have a confined plasma zone separate from the adjacent region which is selectively communicable with the adjacent region via an exhaust system. The processing regions within each chamber also preferably include separate gas distribution assemblies and RF power sources to provide a uniform plasma density over a wafer surface in each processing region. The processing chambers are configured to allow multiple, isolated processes to be performed concurrently in at least two regions so that at least two wafers can be processed simultaneously in separate processing regions with a high degree of process control provided by shared gas sources, shared exhaust systems, separate gas distribution assemblies, separate RF power sources, and separate temperature control systems. For ease of description, the terms processing regions a chamber may be used to designate the zone in which plasma processing is carried out.

FIGS. 4–7 illustrate the processing system 100 of the present invention schematically. The system 100 is a self-contained system having the necessary processing utilities supported on a main frame structure 101 which can be easily installed and which provides a quick start up for operation. The system 100 generally includes four different regions, namely, a front end staging area 102 where wafer cassettes 109 (shown in FIG. 8) are supported and wafers are loaded into and unloaded from a loadlock chamber 112, a transfer chamber 104 housing a wafer handler, a series of tandem process chambers 106 mounted on the transfer chamber 104 and a back end 108 which houses the support utilities needed for operation of the system 100, such as a gas panel 103, power distribution panel 105 and power generators 107. The system can be adapted to accommodate various processes and supporting chamber hardware such as CVD, PVD and etch. The embodiment described below will be directed to a system employing a DCVD process, such as a silane process, to deposit silicon oxide. However, it is to be understood that these other processes are contemplated by the present invention.

Front End Staging Area

Figure 8:
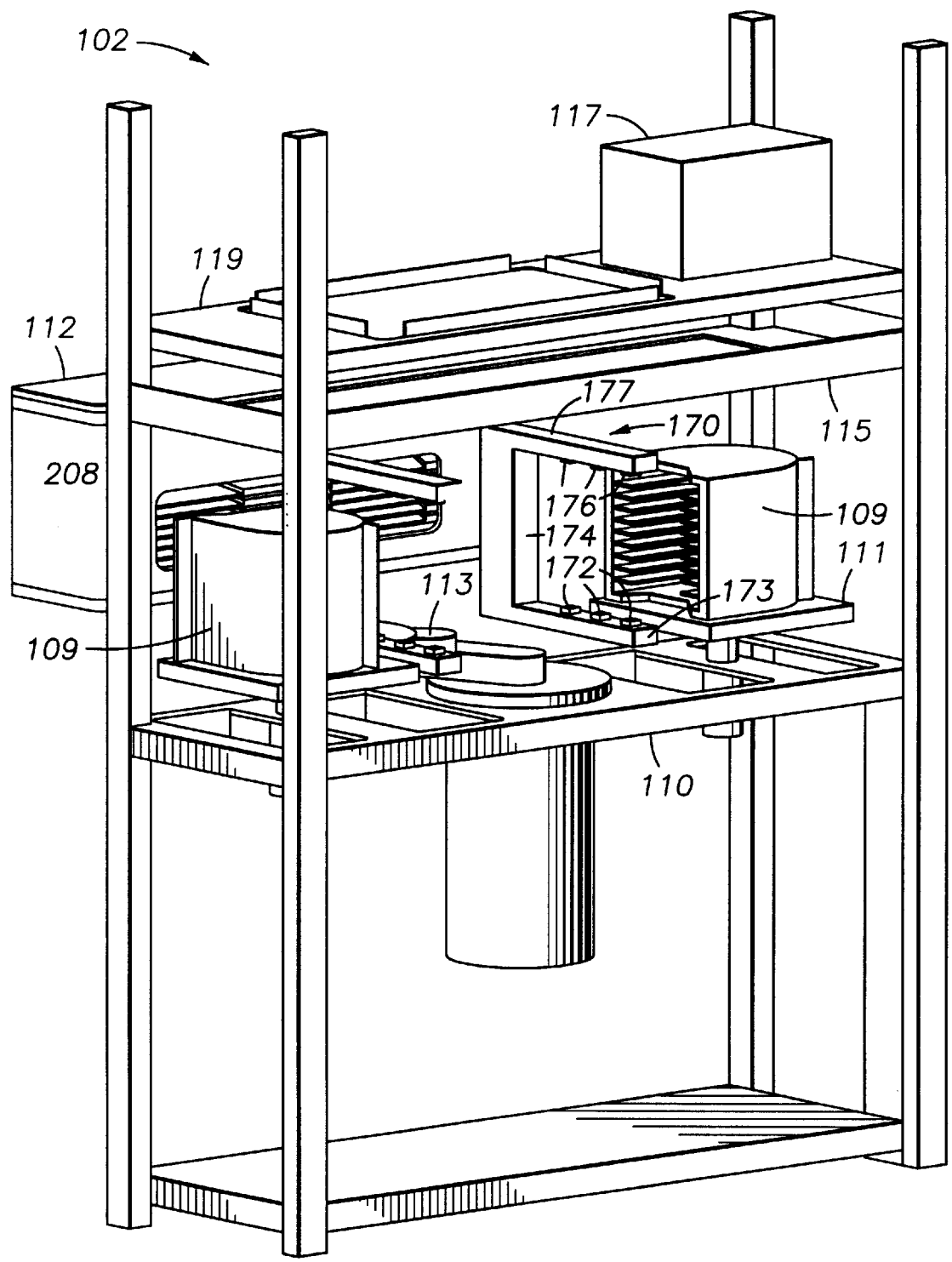
FIG. 8 is a perspective view of the front end loading system of the present invention.

FIG. 8 shows the front end staging area 102 of the system 100 which includes a staging platform 110 having one or more wafer cassette turntables 111 rotationally mounted through the platform 110 to support one or more wafer cassettes 109 for processing. Wafers housed in the wafer cassettes 109 are loaded into the system 100 through one or more doors 137 disposed through a front cover 139 (both shown in FIG. 6). A front end wafer handler 113, such as a robot, is mounted on the staging platform 110 adjacent to the wafer cassette turntables 111 and the loadlock chamber door 209 (shown in FIG. 11). Preferably, the front end wafer handler 113 includes a wafer mapping system to index the wafers in each wafer cassette 109 in preparation for loading the wafers into a loadlock cassette disposed in the loadlock chamber 112. One wafer handler used to advantage in the present system which includes a wafer mapping system is available from Equippe Technologies, Sunnyvale, Calif., as model nos. ATM 107 or 105. The wafer mapping sensor verifies the number of wafers and orientation of the wafers in the cassette 109 before positioning the wafers in the loadlock chamber 112 for processing. An exhaust system such as ULPA filter, available from Enviroco Corporation located in Alburquerque, N. Mex.; Flanders located in San Rafael, California, or Filtra located in Santa Ana, Calif., is mounted to the bottom of a support shelf 115 above the platform 110 to provide particle control on the front end of the system. A computer monitor 117 is supported on a monitor shelf 119 above the support shelf 115 to provide touch control to an operator.

Loadlock Chamber

Figure 9:
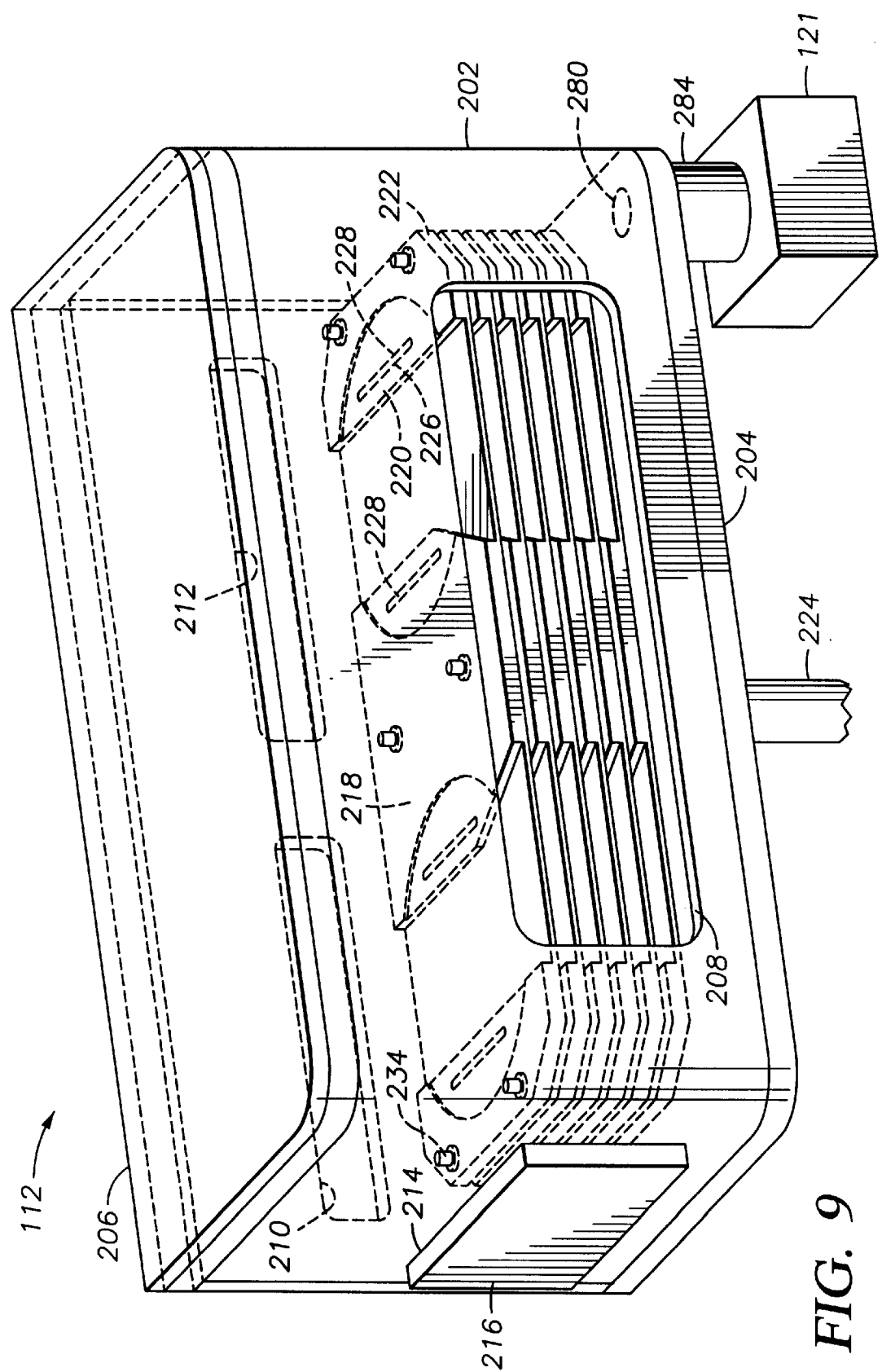
FIG. 9 is a substantially front perspective view of the inside of a loadlock chamber of the present invention.

FIG. 9 shows a substantially side perspective view of one embodiment of a loadlock chamber 112 of the present invention. The loadlock chamber 112 includes a sidewall 202, a bottom 204 and a lid 206. The sidewall 202 defines a loadlock loading port 208 for loading wafers into and unloading wafers out of the vacuum system 100. Passages 210 and 212 are disposed in the sidewall 202 opposite the loading port 208 to allow wafers to be moved from the loadlock chamber 112 into the transfer chamber 104 (not shown). Slit valves and slit valve actuators are used to seal the passages 210 and 212 when isolation or staged vacuum is desired. A service port 214 and service door or window 216 are disposed on one end of the loadlock chamber 112 to provide service and visual access to the loadlock chamber 112.

A loadlock cassette 218 is disposed within the loadlock chamber 112 to support the wafers in a spaced relationship in the loadlock chamber 112 so that a wafer handler can pass between the wafers to place and remove wafers from the loadlock cassette 218. The loadlock cassette 218 preferably supports two or more wafers in a side-by-side arrangement on wafer seats 220. The wafer seats 220 are formed on cassette plates 222 which are supported in spaced relation on a movable shaft 224. Preferably, the plates 222 are made of anodized aluminum and can handle up to about 14 wafers spaced vertically apart by about 0.6 inch. In the embodiment shown in FIG. 9, six rows of wafer seats 220 are provided to support a total of twelve (12) wafers.

Each wafer seat 220 defines at least two grooves 226 in which a support rail 228 is disposed to support a wafer above the wafer seat 220 to provide a cooling gas passage below the wafer. In a preferred embodiment, at least two rails 228 made of a ceramic are provided to support the wafer, but more rails may be used. Wafers are supported about 1 to about 15 mils above the wafer seats 220 on the ceramic rails 228 to provide uniform cooling of the wafers.

The shaft 224 is disposed through the bottom 204 of the loadlock chamber 112 and supports the cassette plates 222 within the loadlock chamber 112. A motor, such as a stepper motor or other elevator system, is disposed below the bottom 204 of the loadlock chamber 112 and moves the shaft 224 upwardly and downwardly within the loadlock chamber 112 to locate a pair of wafers in alignment with a wafer handler for loading or unloading wafers from the loadlock chamber 112.

Figure 10:
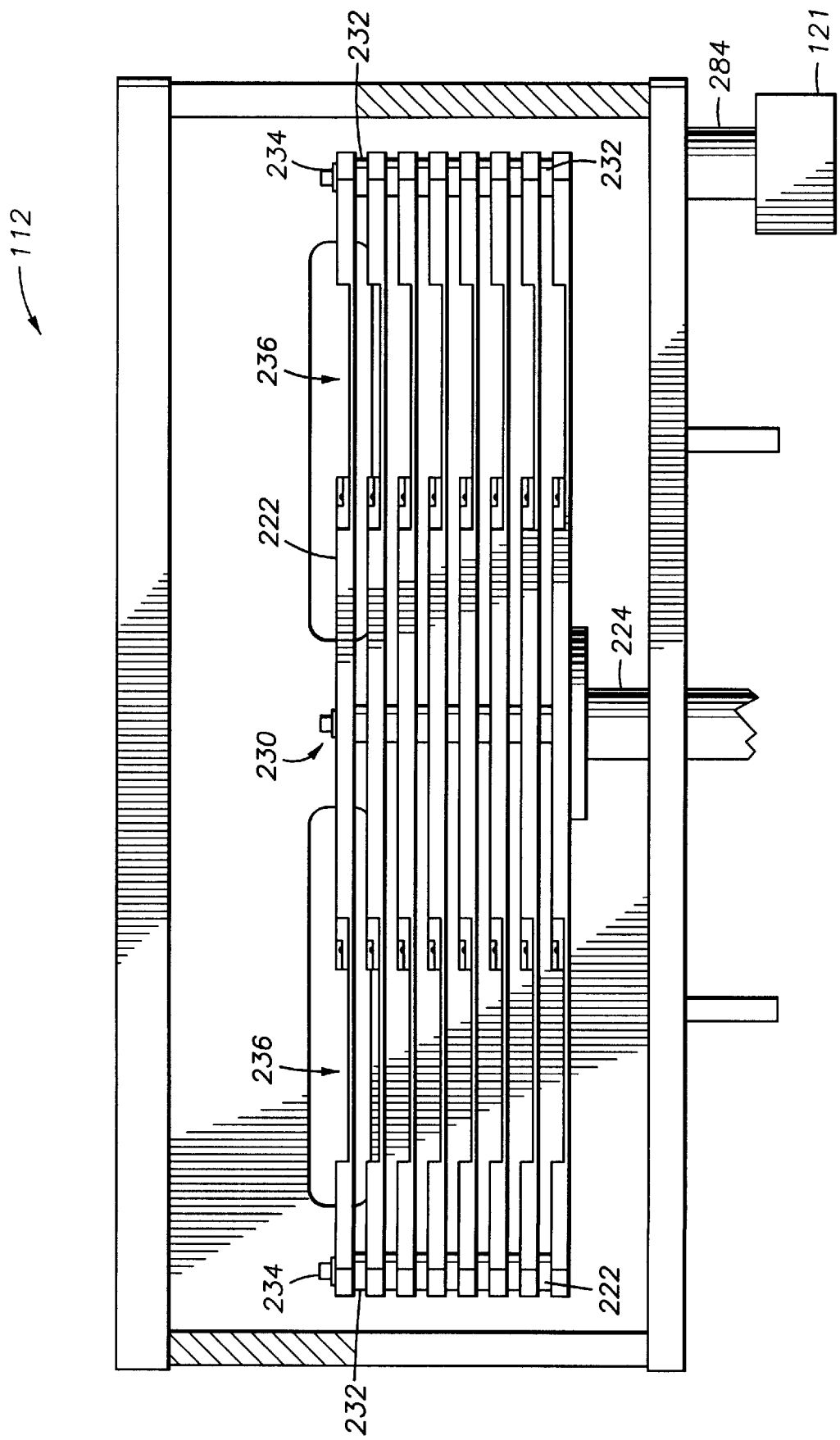
FIG. 10 is a cross sectional view of a loadlock chamber of the present invention.

FIG. 10 shows a side view of the loadlock chamber 112 with the front removed. The cassette plates 222 include a central portion 230 through which the shaft 224 extends to support the plates 222. The outer edges of the cassette plates 222 are supported in a spaced relationship by spacers 232 which are secured thereto with pins 234. Each plate 222 defines a central channel 236 formed into each plate to form a slot for the robot blade to pass under the wafer when the wafer is supported on the seat 220.

Figure 11:
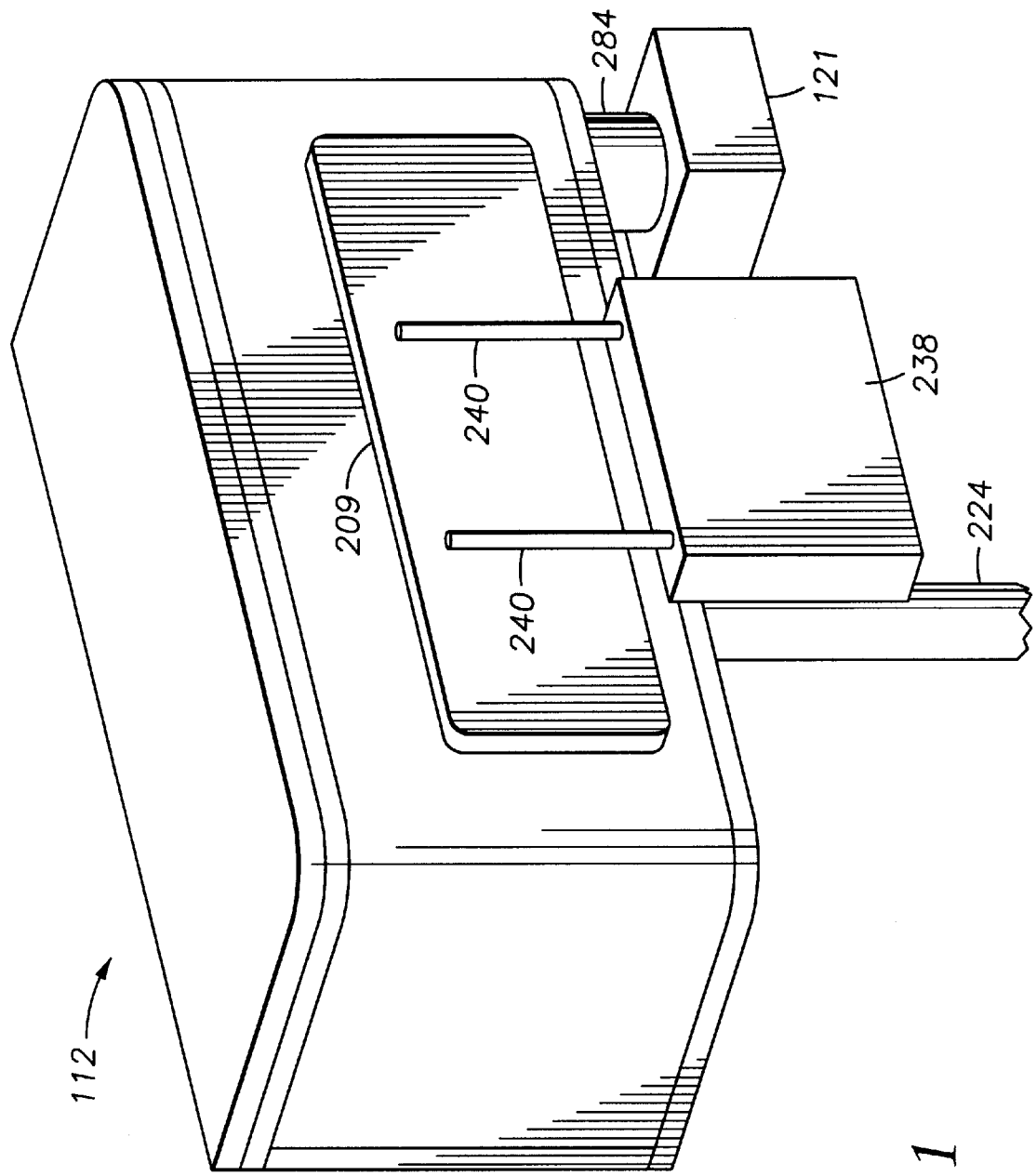
FIG. 11 is a perspective view of a loadlock chamber showing a gate valve and actuating assembly mounted on the front of the loadlock chamber.

FIG. 11 shows a front perspective view of the loadlock chamber 112. Loading door 209 and door actuator 238 are shown in a closed and sealed position. The loading door 209 is connected to the actuator 238 on movable shafts 240. To open the door 209, the actuator 238 tilts away from the side wall 202 to unseal the door 209 and then the shafts 240 are lowered to provide clearance of the door 209 and access to the port 208 (shown in FIG. 9). One door actuator used to advantage with the present invention is available from VAT, located in Switzerland.

An on-board vacuum pump 121 is mounted on the frame 101 adjacent the loadlock chamber 112 and the transfer chamber 104 to pump down the loadlock chamber and the transfer chamber. An exhaust port 280 is disposed through the bottom of the loadlock chamber 112 and is connected to the pump 121 via exhaust line 704. The pump is preferably a high vacuum turbo pump capable of providing milliTorr pressures with very low vibration. One vacuum used to advantage is available from Edward High Vacuum.

The transfer chamber 104 is preferably pumped down through the loadlock chamber 112 by opening a pair of slit valves sealing passages 210, 212 and pumping gases out through the exhaust port 280 located in the loadlock chamber 112. Gas-bound particles are kept from being swept into the transfer chamber 104 by continually exhausting gases out of the system through the loadlock chamber 112. In addition, a gas diffuser 231 is disposed in the loadlock chamber to facilitate venting up to atmosphere. The gas diffuser 231 is a preferably a conduit disposed in the loadlock chamber and connected to a gas purge line such as an $N_2$ purge gas line. The gas diffuser 231 distributes the purge gas along a larger surface area through a plurality of ports 233 disposed along the length of the diffuser, thereby decreasing the time needed to vent the chamber up to atmosphere. The vacuum system of the present invention will be described in more detail below.

Dual Position Loadlock Chamber

Figure 12:
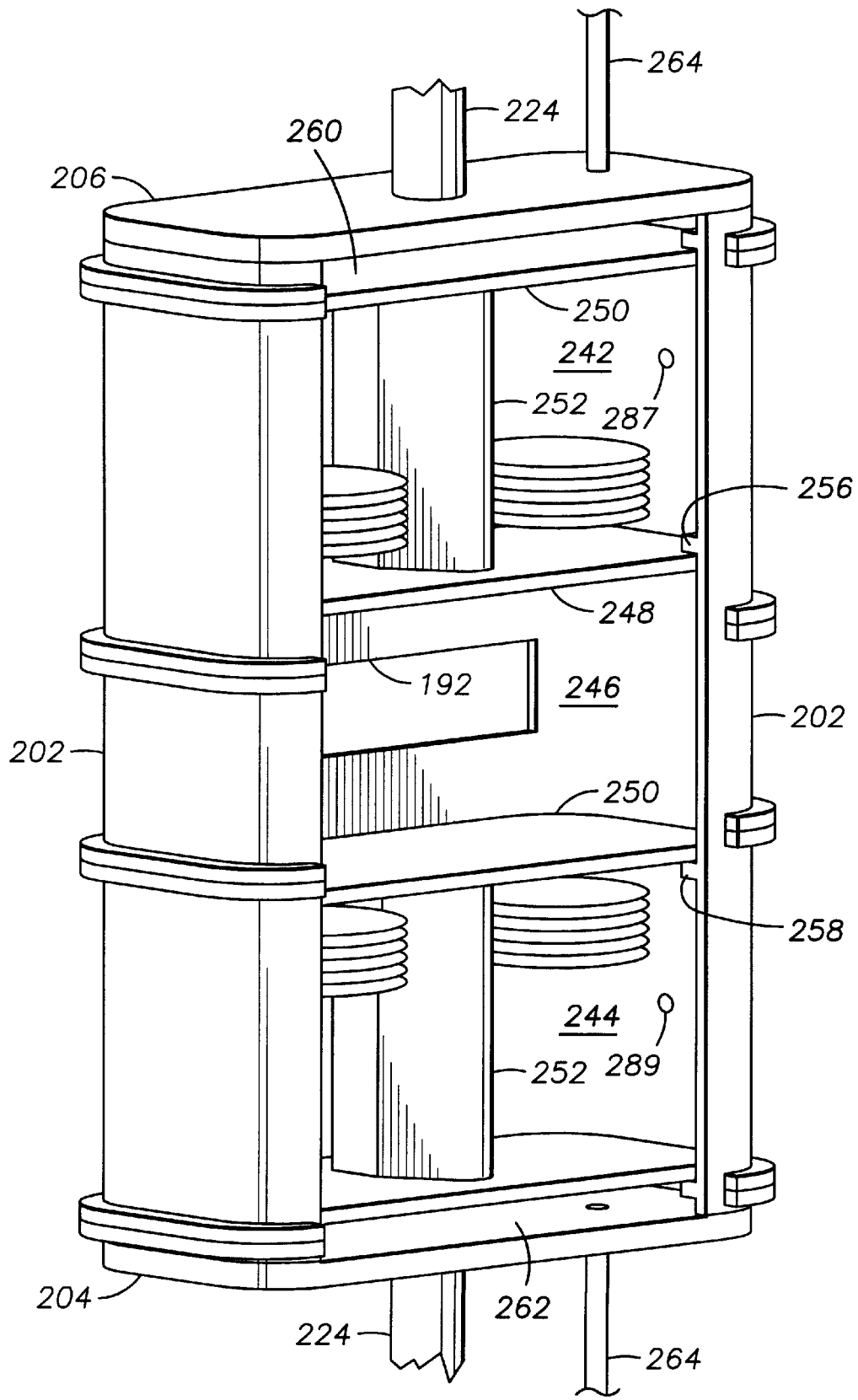
FIG. 12 is a perspective view of another embodiment of a loadlock chamber of the present invention.

FIG. 12 shows a cut-away perspective view of another embodiment of a loadlock chamber 112 of the present invention. The loadlock chamber 112 includes chamber walls 202, a bottom 204, and a lid 206. The chamber 112 includes two separate environments or compartments 242, 244 and a transfer region 246. Compartments 242, 244 include a wafer cassette in each compartment 242, 244 to support the wafers therein. Each compartment 242, 244 includes a support platform 248 and a top platform 250 to define the bottom and top of the compartments 242, 244. A support wall 252 may be disposed vertically within the compartments 242, 244 to support platforms 248, 250 in a spaced relationship. Transfer region 246 includes one or more passages 192 for providing access from the loadlock chamber 112 into the transfer chamber 104 (not shown). Passages 192 are preferably opened and closed using slit valves and slit valve actuators.

Compartments 242, 244 are each connected to an elevator shaft 224, each of which is connected to a motor, such as a stepper motor or the like, to move the compartments upwardly or downwardly within the loadlock chamber 112. A sealing flange 256 is disposed peripherally within the loadlock chamber 112 to provide a sealing surface for support platform 248 of compartment 242. Sealing flange 258 is similarly disposed to provide a sealing surface for support platform 250 of compartment 244. The compartments 242, 244 are isolated from one another by sealing flanges 256, 258 to provide independent staged vacuum of the compartments 242, 244 within the loadlock chamber 112.

A back side pressure is maintained in spaces 260, 262 through a vacuum port disposed therein. A vacuum pump is connected to the spaces 260, 262 via exhaust lines 264 so that a high vacuum can be provided in the spaces 260, 262 to assist in sealing the platforms 248, 250 against the sealing flanges 256, 258.

In operation, compartments 242, 244 can be loaded or unloaded in the position shown in FIG. 12. Loading doors 209 and actuators 238, such as those described above (shown in FIG. 11), are provided through the front wall (not shown) at the upper and lower limits of the loadlock chamber 112 corresponding with compartments 242, 244. The pressure in a selected compartment is pumped down after wafers have been loaded into the compartment via exhaust lines 287, 289 and the selected compartment is moved into the transfer region 246. Compartments 242, 244 move independently into the transfer region 246 by the stepper motor. The advantage of having upper and lower compartments 242, 244 is that processing of one set of wafers can occur while a second set of wafers is loaded into the other compartment and that compartment is pumped down to the appropriate pressure so that the compartment can be moved into the transfer region 246 and in communication with the transfer chamber 104.

Wafer Center-Finding

FIG. 8 shows the wafer handling robot 113 on the front end 102 of the system 100 which includes a wafer transfer blade for transferring wafers from the wafer cassettes 109 into and out of the loadlock chamber 112. The wafers do not always lie in precisely the same position within each wafer cassette 109 and, therefore, are not positioned identically on the blade when they are transferred into the loadlock cassette 218. Thus, before the wafer is loaded into the loadlock cassette, the precise location of the wafer on the robot blade must be determined and provided to a controlling computer. Knowing the exact center of the wafer allows the computer to adjust for the variable position of each wafer on the blade and deposit the wafer precisely in the desired position in a loadlock cassette 218 so that, ultimately, the wafer handler in the transfer chamber can precisely position the wafers in the process chambers 106.

An optical sensing system 170 which provides wafer position data (preferably the center coordinate of the wafer) to enable the robot to precisely position the wafers in the loadlock cassette 218 is provided adjacent to each cassette turntable 111 on the front end 102. Each system comprises three optical sensors 172 mounted on the lower support 173 of a C clamp 174 adjacent the cassette turntable 111 along a line perpendicular to the path of the robot blade and three optical emitters 176 positioned on the upper support 177 of the C clamp 174 aligned with the associated sensors so that the sensors intercept the light beams from the associated emitters. Typically, each pair comprises a conventional infrared emitter and sensor.

The output of the sensors is converted by associated analog-to-digital converters into digital signals which are applied as input to the system computer for use in computing the center coordinate of the wafers as they enter the loadlock chamber 112, and controlling the operation of the robot drive motors as required to enable precise positioning of each wafer in the loadlock cassette 218 by the robot 113. Details of the sensing and motor control circuitry are described in more detail in U.S. Pat. No. 4,819,167, by Cheng et al., which is incorporated herein by reference.

Transfer Chamber

Figure 13:
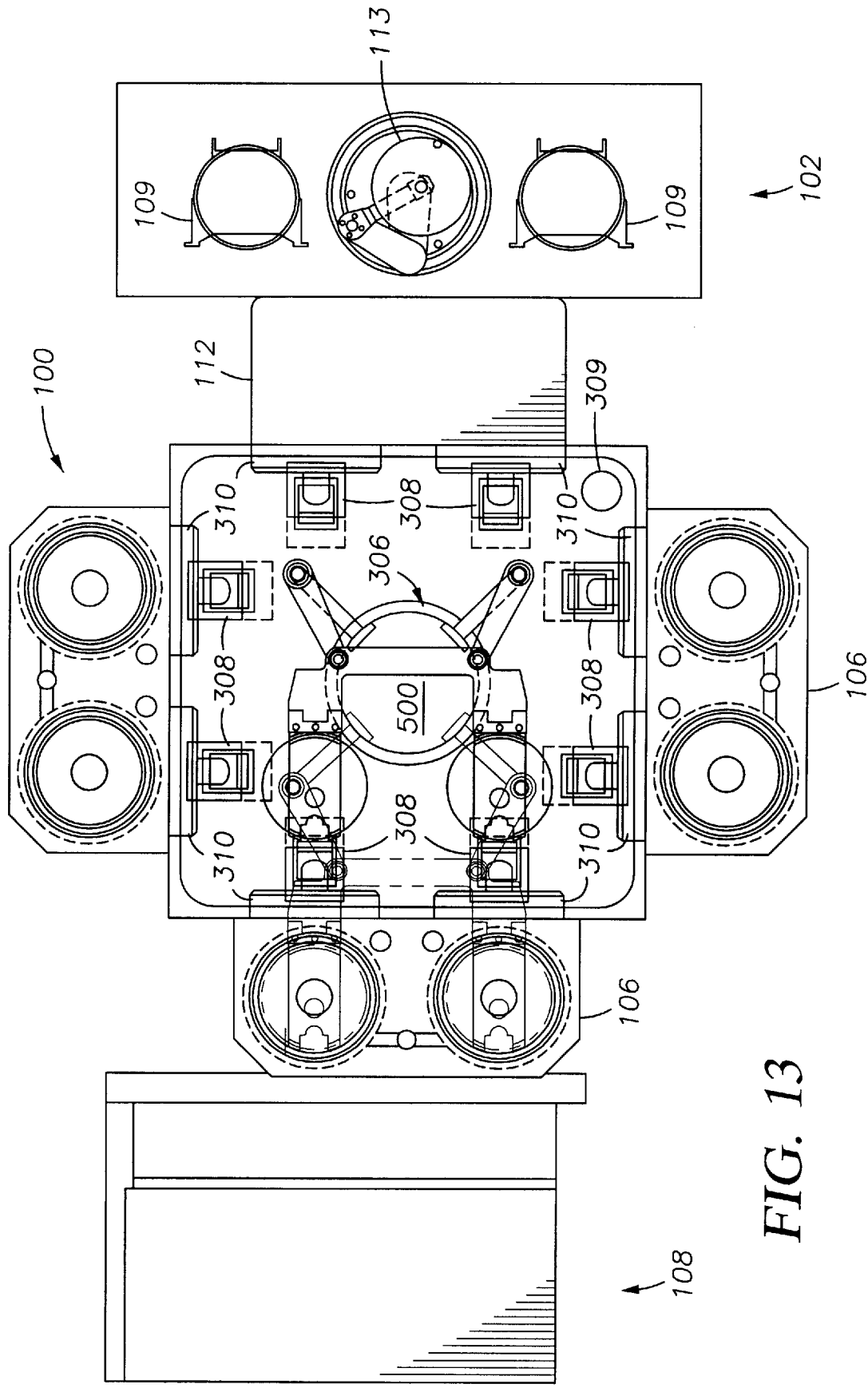
FIG. 13 is a top view of the present invention showing a transfer chamber having a transfer wafer handling member located therein and a front end platform having two wafer cassettes and a front end wafer handling member mounted thereon for wafer mapping and centering.

FIG. 13 shows a top view of the processing system 100 of the present invention. The transfer chamber body includes sidewalls 302 and bottom 304 and is preferably machined or otherwise fabricated from one piece of material, such as aluminum. A lid (not shown) is supported on the sidewalls 302 during operation to form a vacuum enclosure. The sidewall 302 of transfer chamber 104 supports processing chambers 106 and loadlock chamber 112. The sidewall 302 defines at least two passages 310 on each side through which access to the other chambers on the system is provided. Each of the processing chambers 106 and loadlock chamber 112 include one or more slit valve openings and slit valves which enable communication between the processing chambers, the loadlock chamber and the transfer chamber while also providing vacuum isolation of the environments within each of these chambers to enable a staged vacuum within the system. The bottom 304 of the transfer chamber 104 defines a central passage 306 in which a wafer handler 500, such as a robot assembly, extends and is mounted to the bottom of the transfer chamber. In addition, the bottom 304 defines a plurality of passages 308 through which one or more slit valve actuators extend and are sealably mounted. A gas purge port 309 is disposed through the bottom 304 of the transfer chamber 104 to provide a purge gas during pump down.

Figure 14:
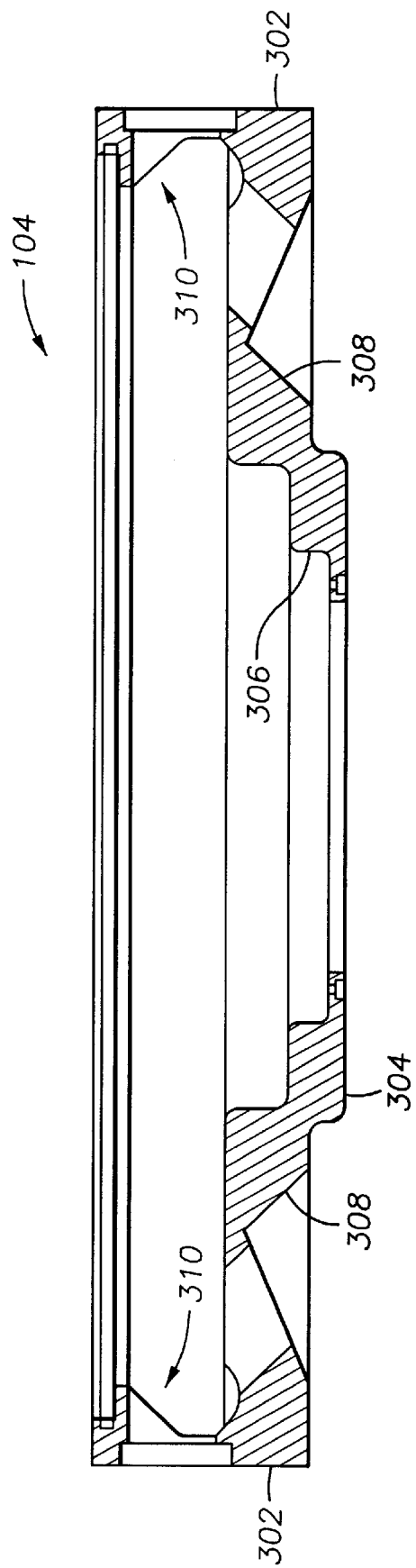
FIG. 14 is a cross sectional side view of a transfer chamber of the present invention.

FIG. 14 shows the transfer chamber 104 in partial cross-section. The passages 310 disposed through the sidewalls 302 can be opened and closed using two individual slit valves or a tandem slit valve assembly. The passages 310 mate with the wafer passages 610 in process regions 618, 620 (shown in FIG. 15) to allow entry of wafers 502 into the processing regions 618, 620 in chambers 106 for positioning on the wafer heater pedestal 628.

Slit valves and methods of controlling slit valves are disclosed by Tepman et al. in U.S. Pat. No. 5,226,632 and by Lorimer in U.S. Pat. No. 5,363,872, both of which are incorporated herein by reference.

Transfer Chamber Wafer Handler

Figure 15:
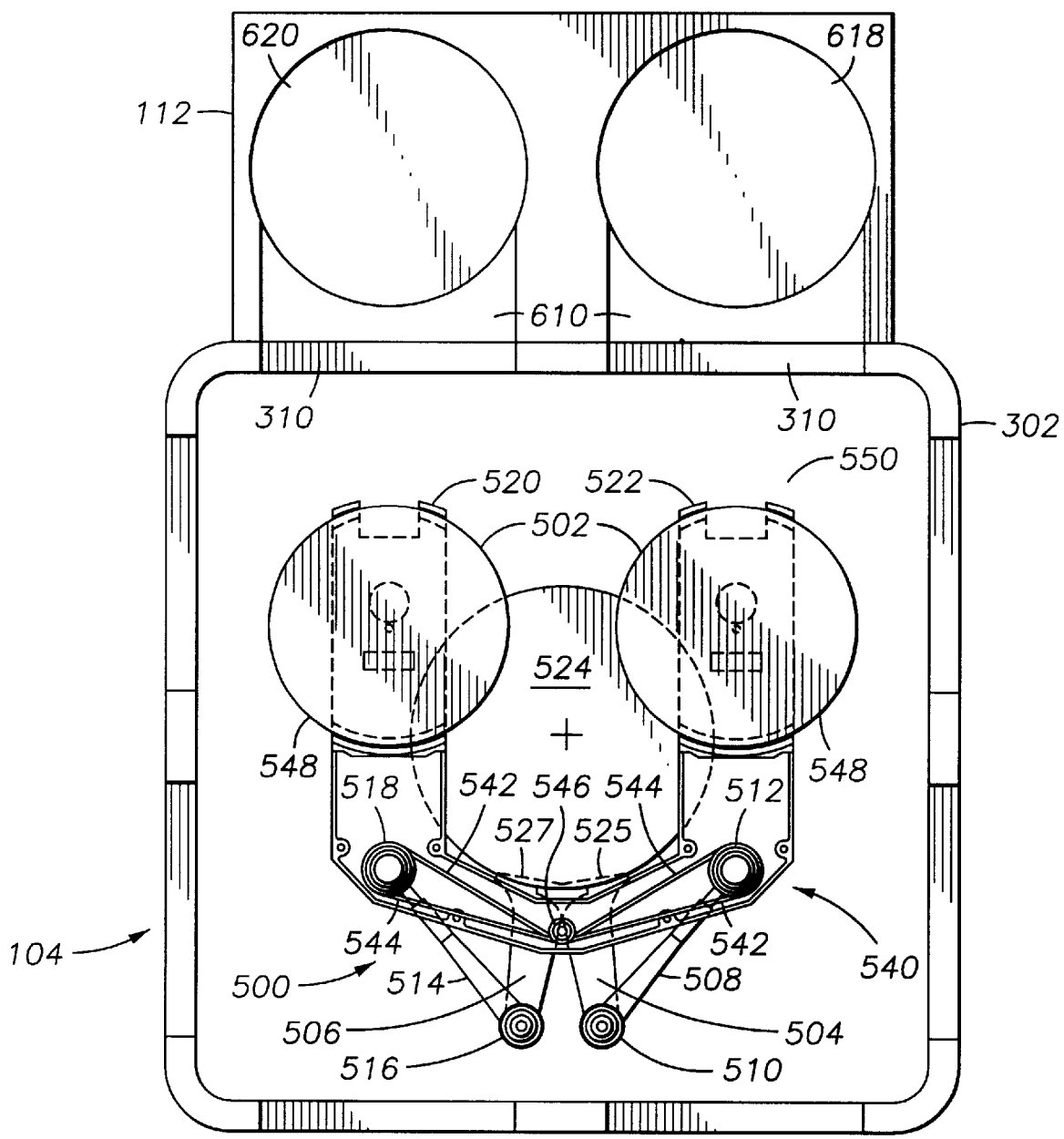
FIG. 15 is a top view of a transfer chamber and a processing chamber showing a wafer handling member of the present invention mounted in the transfer chamber and in a retracted position ready for rotation within the transfer chamber or extension into another chamber.

FIG. 15 shows a top schematic view of a magnetically coupled robot 500 of the present invention in a retracted position for rotating freely within the transfer chamber 104. A robot having dual wafer handling blades 520, 522 is located within the transfer chamber 104 to transfer the wafers 502 from one chamber to another. A "very high productivity" (VHP) type robot which can be modified and used to advantage in the present invention is the subject of U.S. Pat. No. 5,469,035 issued on Nov. 21, 1995, entitled "Two-axis Magnetically Coupled Robot", and is incorporated herein by reference. The magnetically coupled robot 500 comprises a frog-leg type assembly connected between two vacuum side hubs (also referred to as magnetic clamps) and dual wafer blades 520, 522 to provide both radial and rotational movement of the robot blades within a fixed plane. Radial and rotational movements can be coordinated or combined in order to pickup, transfer and deliver two wafers from one location within the system 100 to another, such as from one processing chamber 106 to another chamber.

The robot includes a first strut 504 rigidly attached to a first magnet clamp 524 at point 525 and a second strut 506 rigidly attached to a second magnet clamp 526 (disposed concentrically below the first magnet clamp 524) at point 527 (See also FIG. 17). A third strut 508 is attached by a pivot 510 to strut 504 and by a pivot 512 to the wafer blade assembly 540. A fourth strut 514 is attached by a pivot 516 to strut 506 and by a pivot 518 to the wafer blade assembly 540. The structure of struts 504, 508, 506, 514 and pivots 510, 512, 516, 518 form a "frog leg" type connection between the wafer blade assembly 540 and the magnet clamps 524, 526.

When magnet clamps 524, 526 rotate in the same direction with the same angular velocity, then robot 500 also rotates about axis A in this same direction with the same velocity. When magnet clamps 524, 526 rotate in opposite directions with the same absolute angular velocity, then there is no rotation of assembly 500, but instead, there is linear radial movement of wafer blade assembly 540 to a position illustrated in FIG. 16.

Two wafers 502 are shown loaded on the wafer blade assembly 540 to illustrate that the individual wafer blades 520, 522 can be extended through individual wafer passages 310 in sidewall 302 of the transfer chamber 104 to transfer the wafers 502 into or out of the processing regions 618, 620 of the chambers 106. The magnetically coupled robot 500 is controlled by the relative rotational motion of the magnet clamps 524, 526 corresponding to the relative speed of two motors. A first operational mode is provided in which both motors cause the magnet clamps 524, 526 to rotate in the same direction at the same speed. Because this mode causes no relative motion of the magnet clamps, the robot will merely rotate about a central axis A, typically from a position suitable for wafer exchange with one pair of processing regions 618, 620 to a position suitable for wafer exchange with another pair of processing regions. Furthermore, as the fully retracted robot is rotated about the central axis A, the outermost radial points 548 along the edge of the wafer define a minimum circular region 550 required to rotate the robot. The magnetically coupled robot also provides a second mode in which both motors cause the magnet clamps 524, 526 to rotate in opposite directions at the same speed. This second mode is used to extend the wafer blades 520, 522 of the wafer blade assembly 540 through the passages 310 and into the processing regions 618, 620 or, conversely, to withdraw the blades therefrom. Other combinations of motor rotation can be used to provide simultaneous extension or retraction of the wafer blade assembly 540 as the robot 500 is being rotated about axis A.

Figure 16:
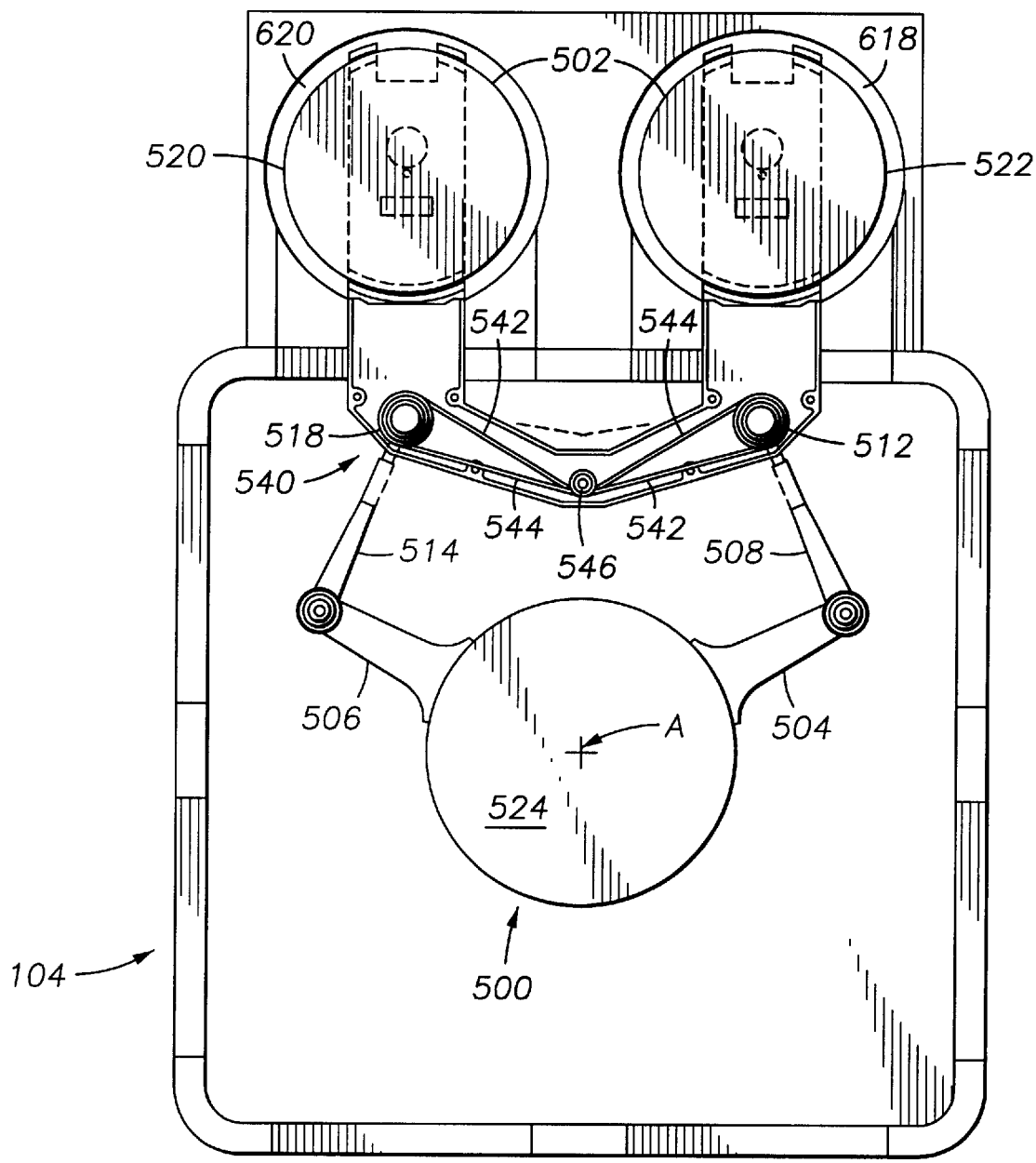
FIG. 16 is a top view of a transfer chamber and a processing chamber showing a wafer handling member of the present invention mounted in the transfer chamber and in an extended position wherein the blades are positioned in the processing chamber.

To keep the wafer blades 520, 522 of the wafer blade assembly 540 directed radially away from the rotational axis A, an interlocking mechanism is used between the pivots or cams 512, 518 to assure an equal and opposite angular rotation of each pivot. The interlocking mechanism may take on many designs, including intermeshed gears or straps pulled around the pivots in a figure-8 pattern or the equivalent. One preferred interlocking mechanism is a pair of metal straps 542 and 544 that are coupled to and extend between the pivots 512, 518 of the wafer blade assembly 540. The straps 542, 544 cooperate to form a figure-8 around the pivots 512, 518. However, it is preferred that the straps 542, 544 be individually adjustable and positioned one above the other. For example, a first end of the first strap 542 may pass around the back side of pivot 512 and be fixedly coupled thereto, while a second end passes around the front side of pivot 518 and is adjustably coupled thereto. Similarly, a first end of the second strap 544 may pass around the back side of pivot 518 and be fixedly coupled thereto, while a second end passes around the front side of pivot 512 and is adjustably coupled thereto. The adjustable couplings between the straps and the front sides of the pivots 512, 518 are preferably provided with a spring that pulls a precise tension on the strap. Once the tension is established, the end of the strap is firmly held in position with a screw or other fastener. In FIGS. 15 and 16, the straps are also shown passing around a rod 546 at the base of the U-shaped dual blade.

FIG. 16 shows the robot arms and blade assembly of FIG. 15 in an extended position. This extension is accomplished by the simultaneous and equal rotation of magnet clamp 526 in a clock-wise direction and magnet clamp 524 in a counter-clockwise rotation. The individual blades 520, 522 of the wafer blade assembly 540 are sufficiently long to extend through the passages 310 and center the wafers 502 over the pedestals 628 (See FIG. 19). Once the wafers 502 have been lifted from the blades by a pair of lift pin assemblies, then the blades are retracted and the passages 310 are closed by a slit valve and actuator as described above.

Figure 17:
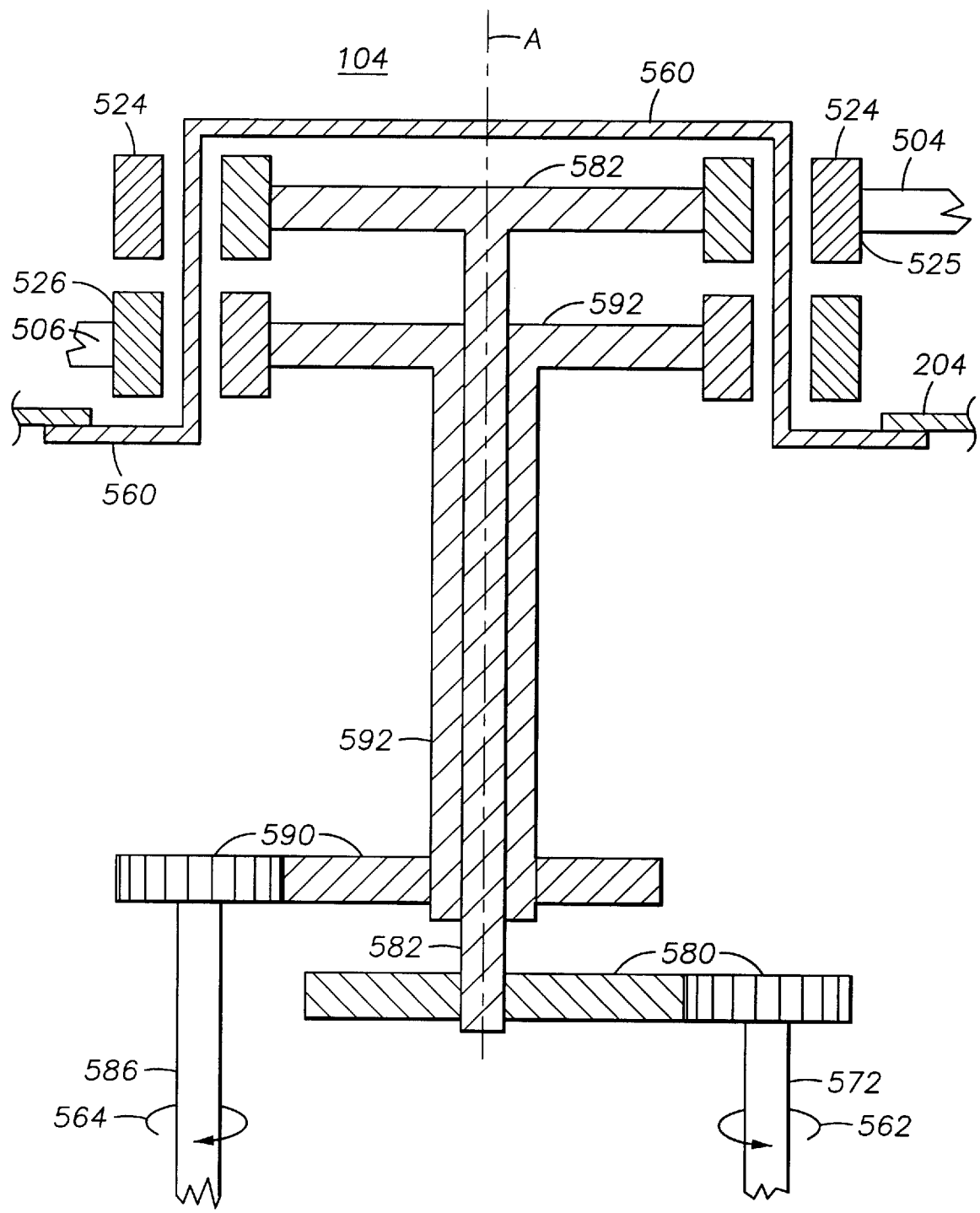
FIG. 17 is a cross sectional view of a magnetically coupled actuating assembly of a wafer handling system of the present invention.

FIG. 17 shows a cross sectional view of a robot drive system mounted to the central opening 306 in the bottom 304 of the transfer chamber 104. The magnetic coupling assembly is configured to rotate magnetic retaining rings 524, 526 about the central axis A, thereby providing a drive mechanism to actuate the wafer blade assembly 540 within the system, both rotationally and linearly. Additionally, the magnetic coupling assembly provides rotational movement of the magnetic retaining rings 524, 526 with minimal contacting moving parts within the transfer chamber 104 to minimize particle generation. In this embodiment, the robot features are provided by fixing first and second stepper or servo motors in a housing located above or below the transfer chamber 104, preferably below, and coupling the output of the motors to magnetic ring assemblies located inwardly of and adjacent to a thin wall 560. The thin wall 560 is connected to the upper or lower wall 304 of the transfer chamber 104 at a sealed connection to seal the interior of the transfer chamber from the environment outside of the chamber. Magnetic retaining rings 524, 526 are located on the vacuum side of transfer chamber 104, adjacent to and surrounding the thin wall 560.

A first motor output 562 drives a first shaft 572 and intermeshed gears 580 to provide rotation to the first magnetic ring assembly 582 that is magnetically coupled to the first magnetic retaining ring 524. A second motor output 564 drives a second shaft 586 and intermeshed gears 590 to provide rotation to the second magnetic ring assembly 592 (a concentric cylindrical member disposed about assembly 582) that is magnetically coupled to a second magnetic retaining ring 526. Rotation of each motor provides rotational outputs 562, 564 that rotate the magnet ring assemblies 582, 592 which magnetically couple the rotary output through the thin wall 560 to magnetic retaining rings 524, 526, thereby rotating the struts 504, 506, respectively, and imparting rotational and translational motion to the wafer blade assembly 540.

To couple each magnet ring assembly to its respective magnetic retaining ring, each magnet ring assembly 582, 592 and magnetic retaining ring 524, 526 preferably include an equal plurality of magnets paired with one another through wall 560. To increase magnetic coupling effectiveness, the magnets may be positioned with their poles aligned vertically, with pole pieces extending therefrom and toward the adjacent magnet to which it is coupled. The magnets which are coupled are flipped, magnetically, so that north pole to south pole coupling occurs at each pair of pole pieces located on either side of the thin walled section. While magnetic coupling is preferred, direct coupling of the motors to the retaining rings may also be employed.

Optimal Path Trajectory of Robot

The movement of the robot 500 while transferring wafers is primarily constrained by reliance on friction between the wafer and the dual wafer blades 520, 522 for gripping the wafers. Both linear and rotational movement of each wafer blade 520, 522 must be controlled to avoid misalignment of the wafers. Movement of the robot is preferably optimized to provide a minimum wafer transfer time to improve productivity while avoiding wafer misalignment.

Optimization of robotic movement has been described in publications, such as Z. Shiller and S. Dubowsky, "Time Optimal Path Planning for Robotic Manipulators with Obstacles, Actuator, Gripper and Payload Constraints", International Journal of Robotics Research, pp. 3–18, 1989, and Z. Shiller and H. H. Lu, "Comparison of Time-Optimal Motions Along Specified Paths", ASME Journal of Dynamic Systems, Measurements and Control, 1991, which provide mathematical approaches to finding the time optimal path between two or more points for a given robot configuration. The approach generally involves a mathematical approximation of a specified path and calculation of an optimal velocity profile, and the calculation of an optimal path by varying path parameters to find the minimum time required for the robot to follow a specified path within all known constraints.

A mathematical solution to optimization of robot movement typically involves the solution of multiple algebraic equations and non-linear differential equations or non-linear matrix differential equations, and is preferably assisted by a computer. However, persons skilled in the optimization methods can often identify the more optimum path without resolving the matrices or the equations.

Figure 26:
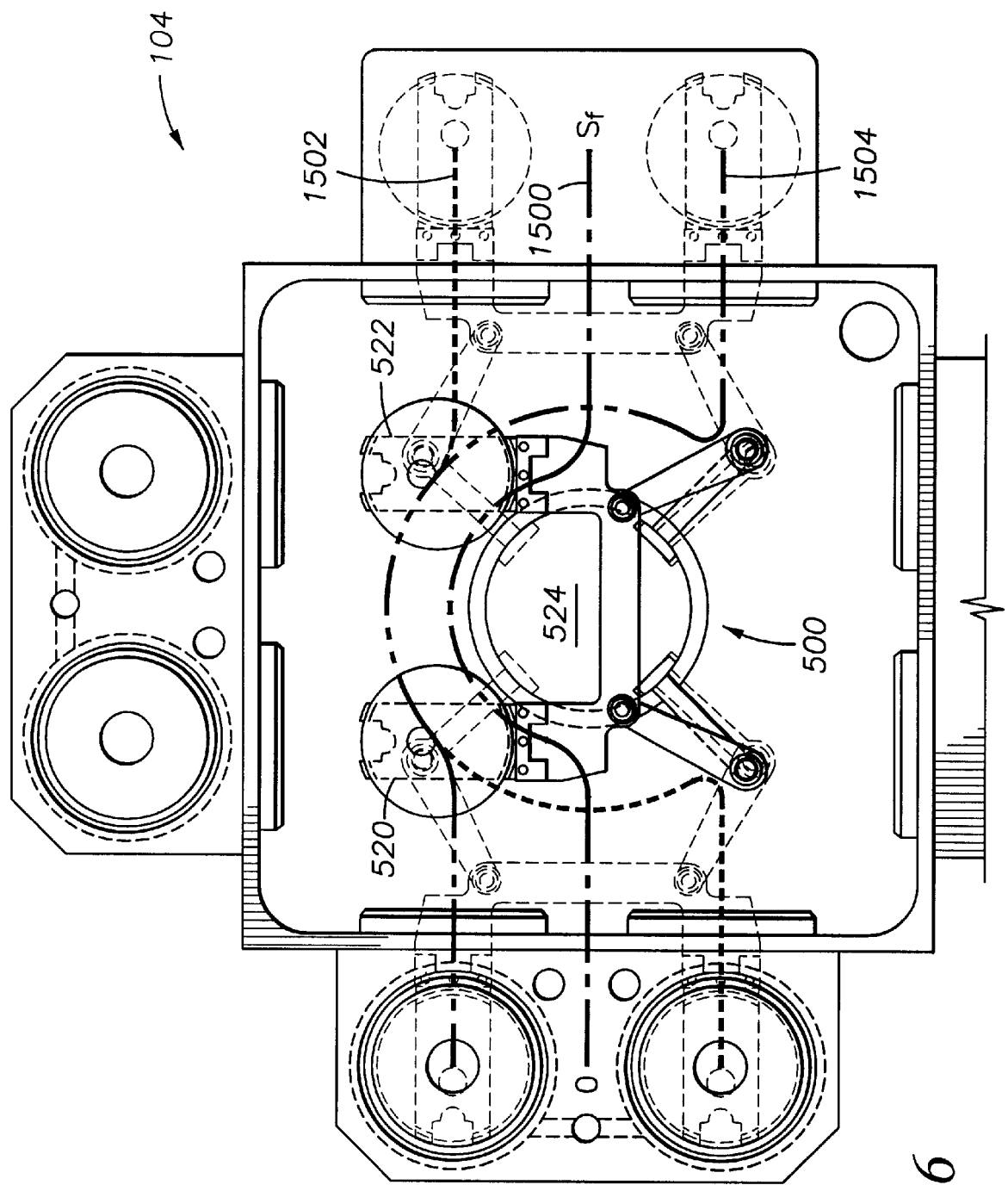
FIG. 26 is a top view of a transfer chamber showing a time optimal path for a robot of the present invention.
Figure 27:
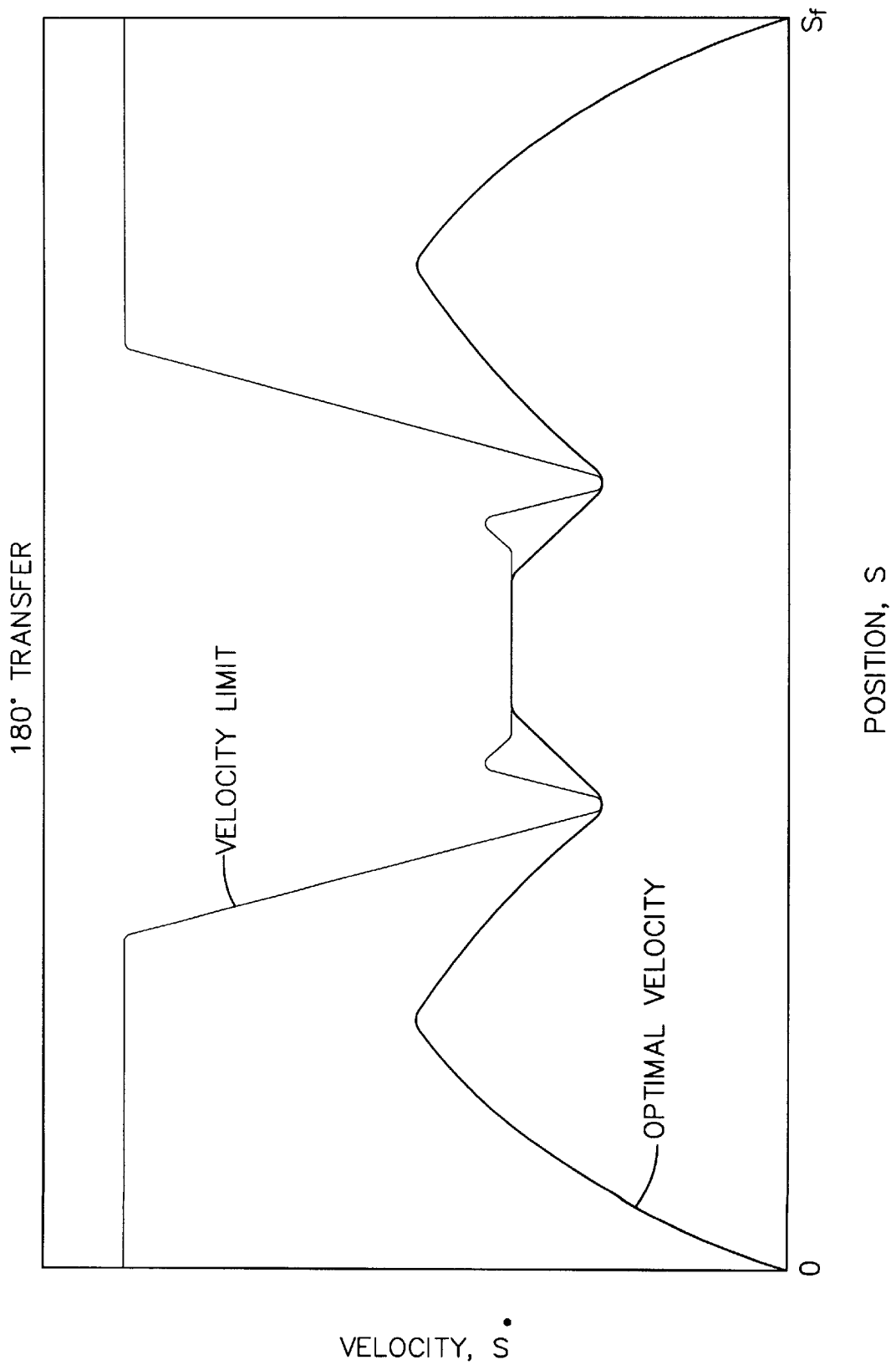
FIG. 27 is a graph showing the optimal velocity profile for the path shown in FIG. 26.
Figure 28:
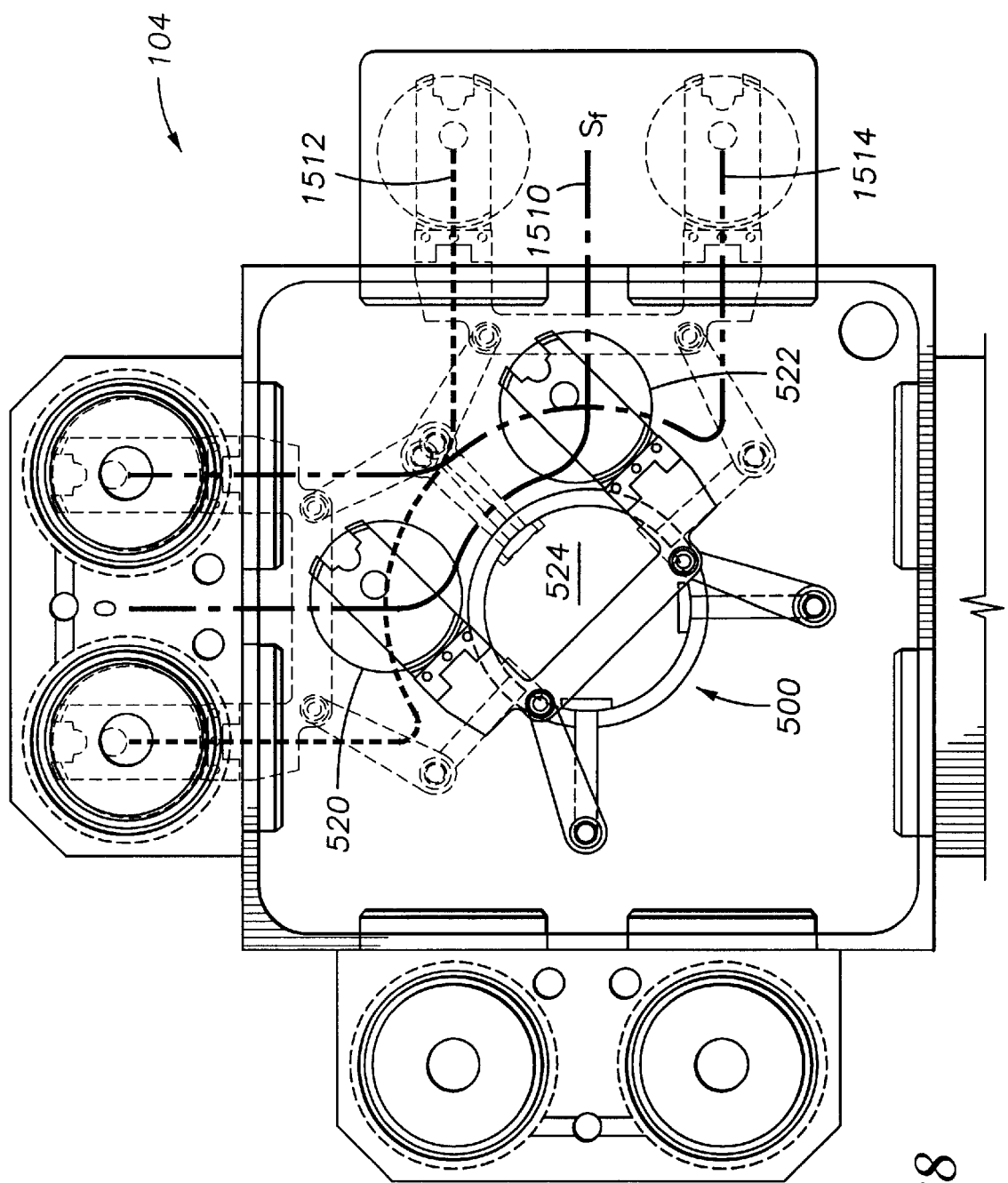
FIG. 28 is a top view of a transfer chamber showing a time optimal path for a robot of the present invention.
Figure 29:
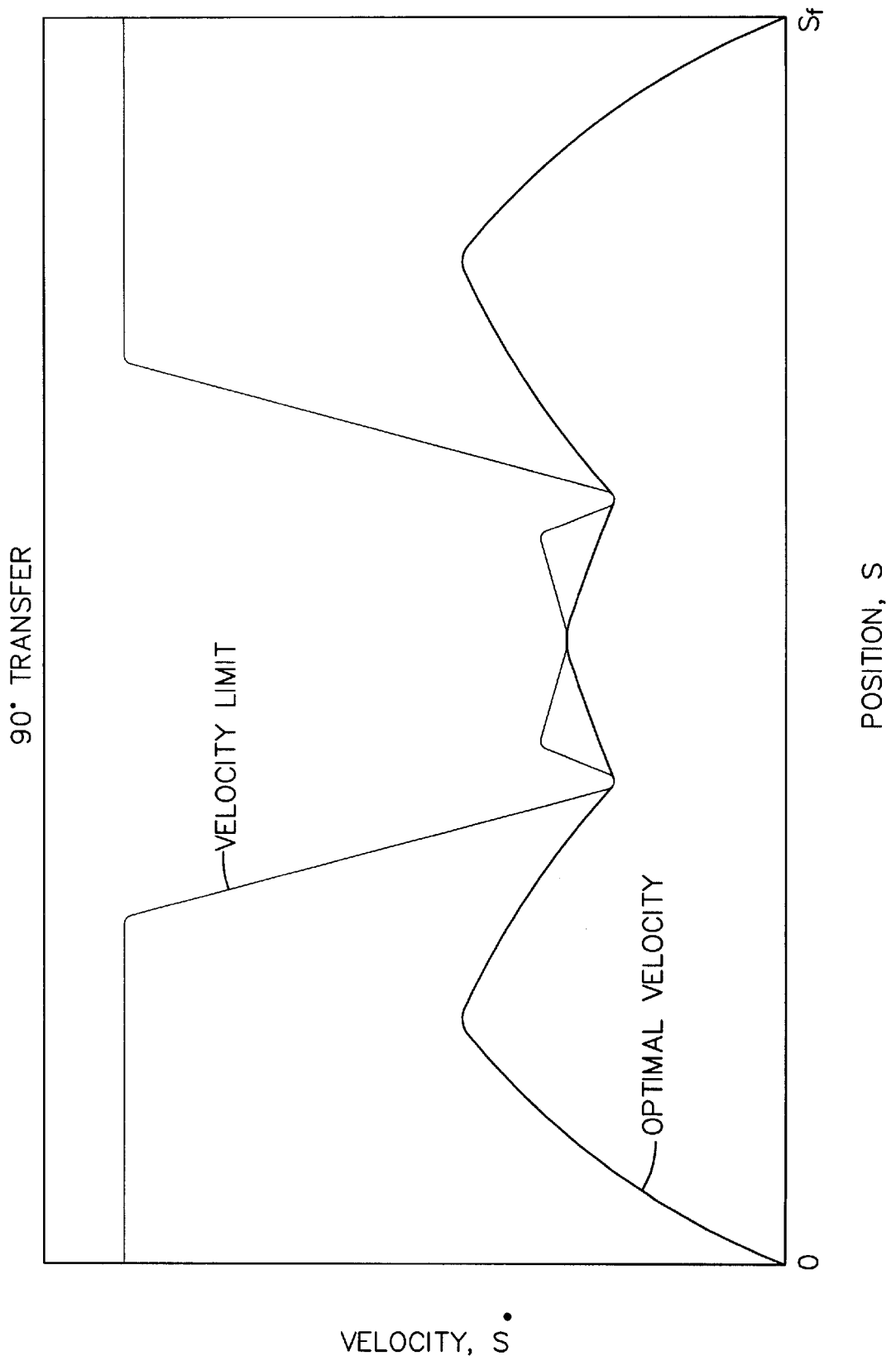
FIG. 29 is a graph showing the optimal velocity profile for the path shown in FIG. 28.

Optimization of wafer movement using the robot 500 described above resulted in definition of several time optimal paths which are expected to significantly improve productivity of the processing system of the present invention. The time optimal paths are shown in FIGS. 26–29. FIG. 26 shows the optimal paths 1500, 1502, 1504 for moving wafers between chambers positioned 1800 apart on the processing platform and FIG. 27 shows the optimal velocity profile for a path 1500 halfway between paths 1502, 1504 taken by wafers on the dual wafer blades 520, 522. FIG. 28 shows the optimal paths 1510, 1512, 1514 for moving wafers between chambers positioned 90° apart on the processing platform and FIG. 29 shows the optimal velocity profile for a path 1510 halfway between paths 1512, 1514 taken by wafers on the dual wafer blades 520, 522.

FIGS. 27 and 29 also show the maximum velocities which can be attained by the robot 500 along the paths 1500, 1510 when wafers are not positioned on the dual wafer blades 520, 522. The robot 500 is preferably controlled so that the dual wafer blades 520, 522 follow the optimal paths using the optimal velocity profiles shown in FIGS. 26–29 when moving wafers through the transfer chamber 104.

Process Chambers

Figure 18:
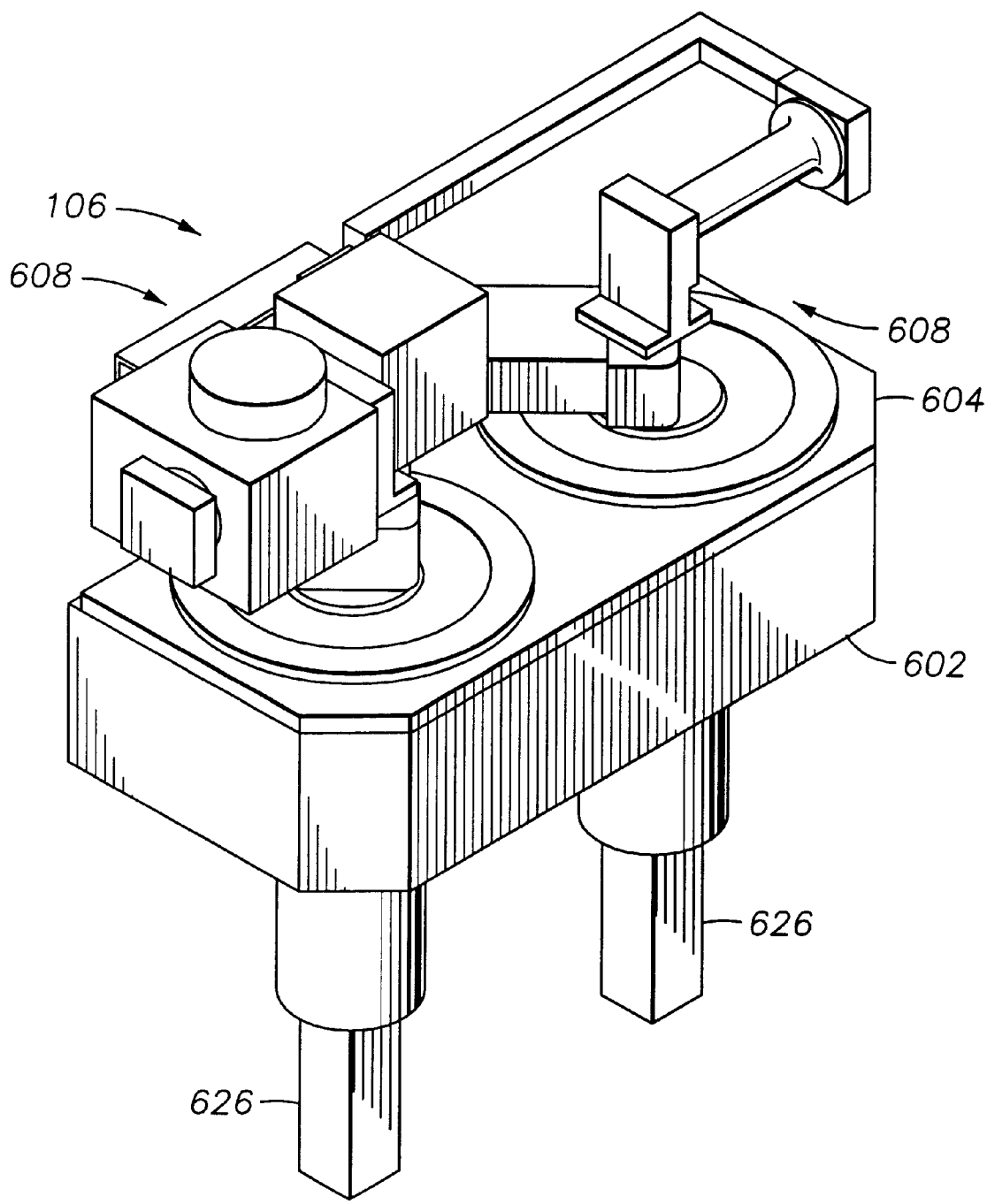
FIG. 18 is a perspective view of one embodiment of a processing chamber of the present invention.

FIG. 18 shows a perspective view of one embodiment of a tandem processing chamber 106 of the present invention. Chamber body 602 is mounted or otherwise connected to the transfer chamber 104 and includes two processing regions in which individual wafers are concurrently processed. The chamber body 602 supports a lid 604 which is hindgedly attached to the chamber body 602 and includes one or more gas distribution systems 608 disposed therethrough for delivering reactant and cleaning gases into multiple processing regions.

Figure 19:
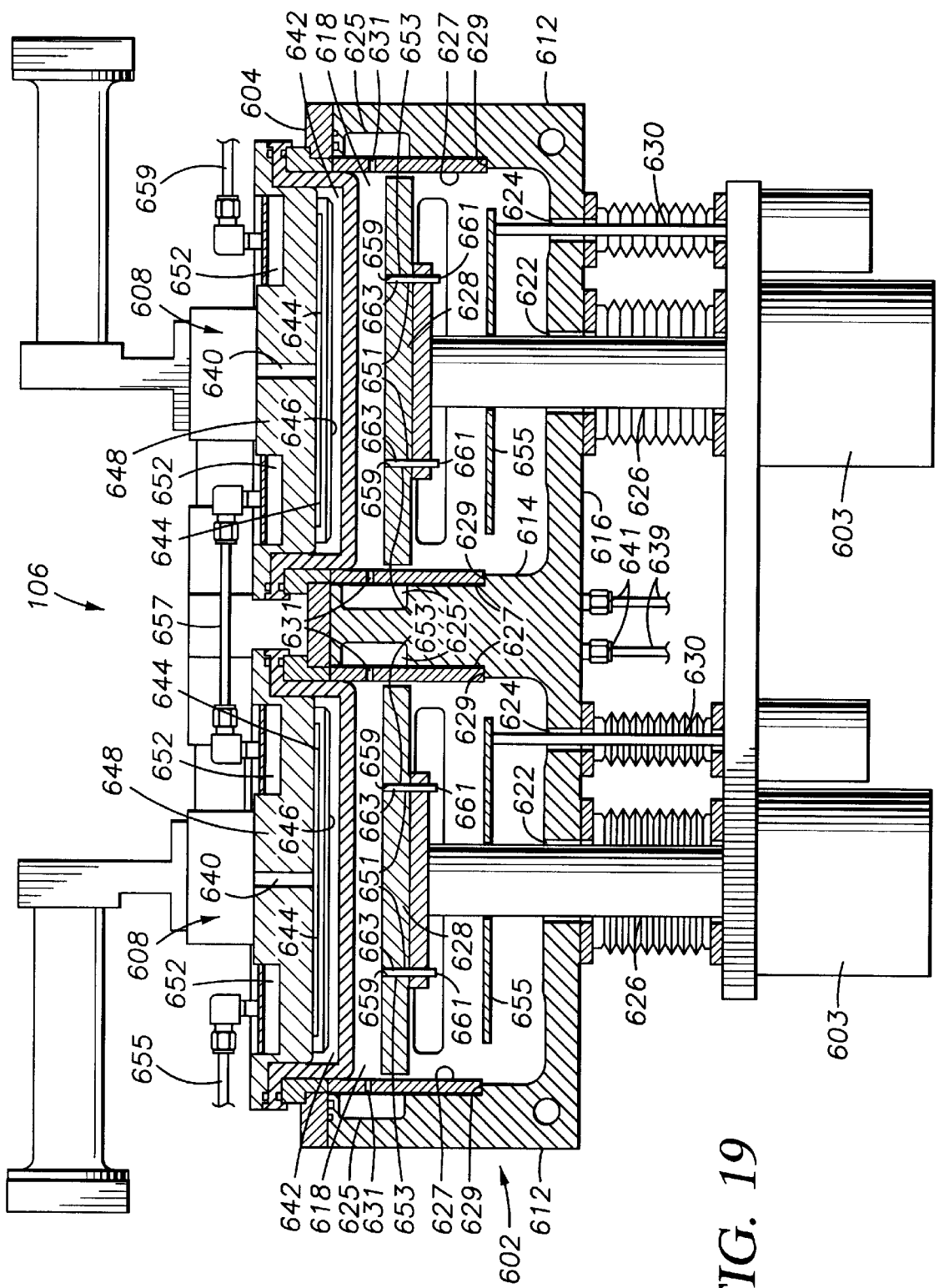
FIG. 19 is a cross sectional view of one embodiment of a processing chamber of the present invention.

FIG. 19 shows a schematic cross-sectional view of the chamber 106 defining two processing regions 618, 620. Chamber body 602 includes sidewall 612, interior wall 614 and bottom wall 616 which define the two processing regions 618, 620. The bottom wall 616 in each processing region 618, 620 defines at least two passages 622, 624 through which a stem 626 of a pedestal heater 628 and a rod 630 of a wafer lift pin assembly are disposed, respectively. A pedestal lift assembly and the wafer lift will be described in detail below.

The sidewall 612 and the interior wall 614 define two cylindrical annular processing regions 618, 620. A circumferential pumping channel 625 is formed in the chamber walls defining the cylindrical processing regions 618, 620 for exhausting gases from the processing regions 618, 620 and controlling the pressure within each region 618, 620. A chamber liner or insert 627, preferably made of ceramic or the like, is disposed in each processing region 618, 620 to define the lateral boundary of each processing region and to protect the chamber walls 612, 614 from the corrosive processing environment and to maintain an electrically isolated plasma environment between the electrodes. The liner 627 is supported in the chamber on a ledge 629 formed in the walls 612, 614 of each processing region 618, 620. The liner includes a plurality of exhaust ports 631, or circumferential slots, disposed therethrough and in communication with the pumping channel 625 formed in the chamber walls. Preferably, there are about twenty four ports 631 disposed through each liner 627 which are spaced apart by about 15° and located about the periphery of the processing regions 618, 620. While twenty four ports are preferred, any number can be employed to achieve the desired pumping rate and uniformity. In addition to the number of ports, the height of the ports relative to the face plate of the gas distribution system is controlled to provide an optimal gas flow pattern over the wafer during processing.

Figure 21:
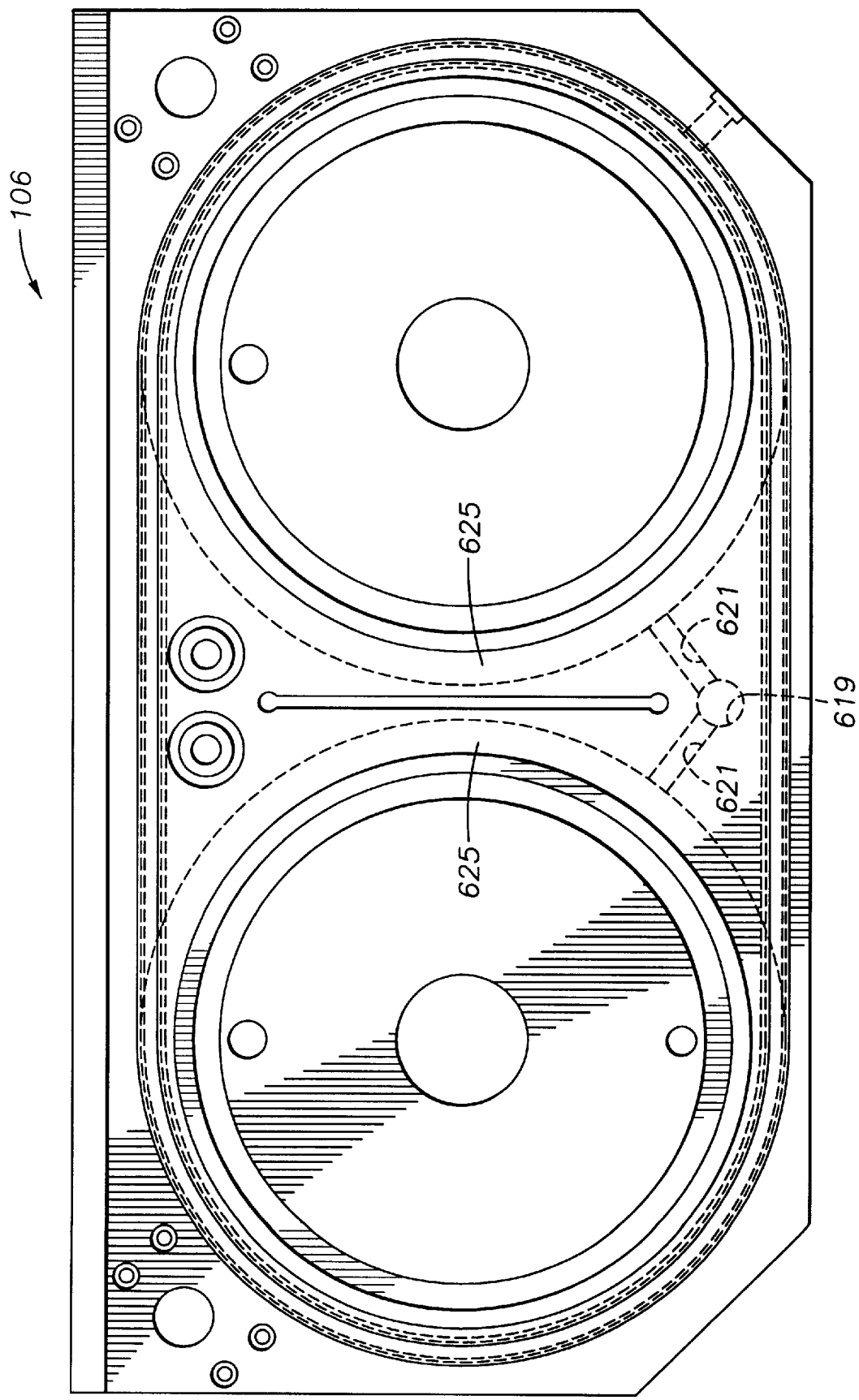
FIG. 21 is a top view of a processing chamber of the present invention with the lid removed.

FIG. 21 shows a cross sectional view of the chamber illustrating the exhaust system of the present invention. The pumping channels 625 of each processing region 618, 620 are preferably connected to a common exhaust pump via a common exhaust channel 619. The exhaust channel 619 is connected to the pumping channel 625 of each region 618, 620 by exhaust conduits 621. The exhaust channel 619 is connected to an exhaust pump via an exhaust line (not shown). Each region is preferably pumped down to a selected pressure by the pump and the connected exhaust system allows equalization of the pressure within each region.

Referring back to FIG. 19, each of the processing regions 618, 620 also preferably include a gas distribution assembly 608 disposed through the chamber lid 604 to deliver gases into the processing regions 618, 620, preferably from the same gas source. The gas distribution system 608 of each processing region includes a gas inlet passage 640 which delivers gas into a shower head assembly 642. The shower head assembly 642 is comprised of an annular base plate 648 having a blocker plate 644 disposed intermediate a face plate 646. An RF feedthrough provides a bias potential to the showerhead assembly to facilitate generation of a plasma between the face plate 646 of the showerhead assembly and the heater pedestal 628. A cooling channel 652 is formed in a base plate 648 of each gas distribution system 608 to cool the plate during operation. An inlet 655 delivers a coolant fluid, such as water or the like, into the channels 652 which are connected to each other by coolant line 657. The cooling fluid exits the channel through a coolant outlet 659. Alternatively, the cooling fluid is circulated through the manifold.

Figure 20:
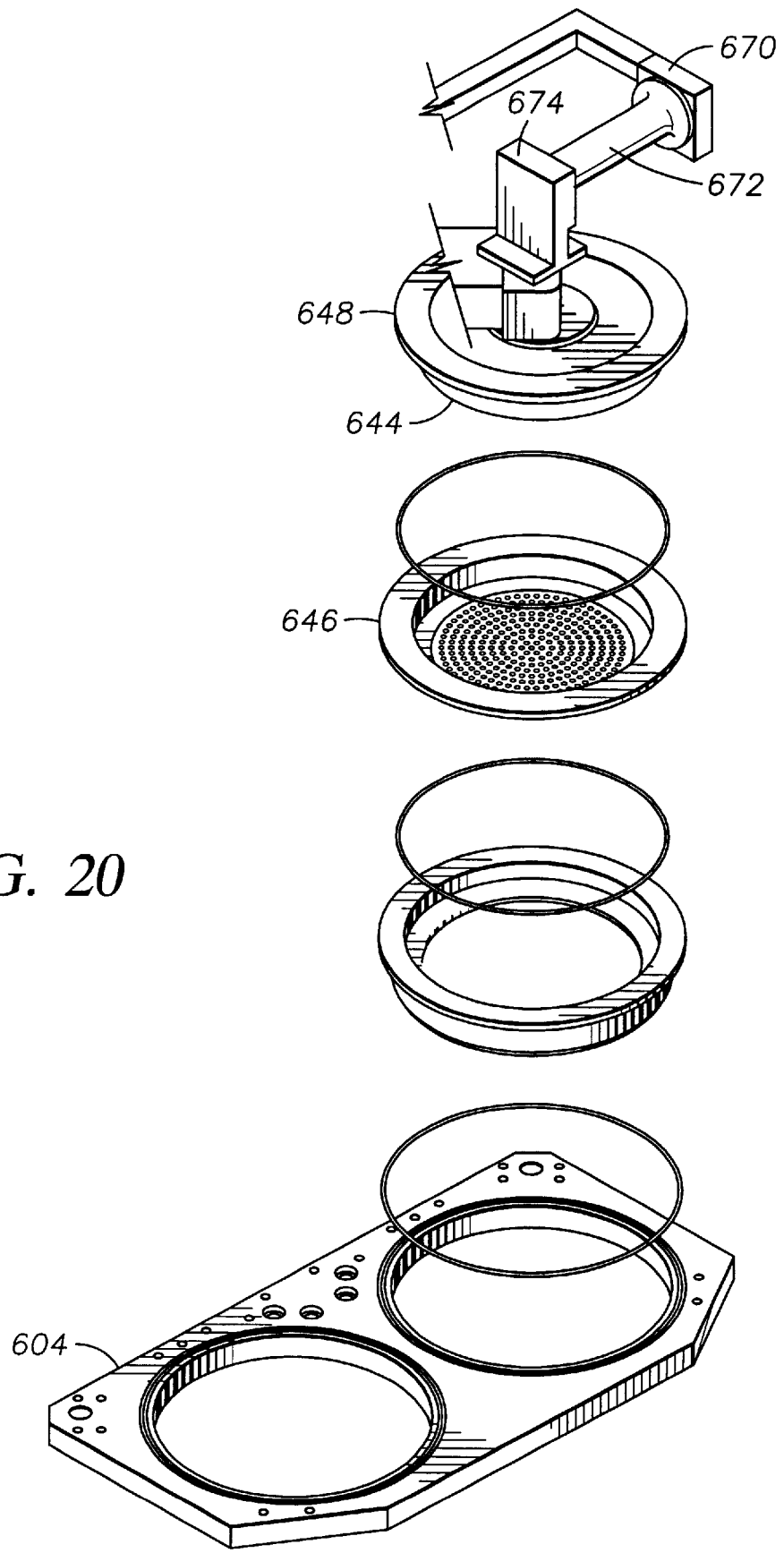
FIG. 20 is an exploded view of the gas distribution assembly.

The chamber body 602 defines a plurality of vertical gas passages for each reactant gas and cleaning gas suitable for the selected process to be delivered in the chamber through the gas distribution system. Gas inlet connections 641 are disposed at the bottom of the chamber 106 to connect the gas passages formed in the chamber wall to the gas inlet lines 639. An o-ring is provided around each gas passage formed through the chamber wall on the upper surface of the chamber wall to provide sealing connection with the lid as shown in FIG. 21. The lid includes matching passages to deliver the gas from the lower portion of the chamber wall into a gas inlet manifold 670 positioned on top of the chamber lid as shown in FIG. 20. The reactant gases are delivered through a voltage gradient feed-through 672 and into a gas outlet manifold 674 which is connected to a gas distribution assembly.

The gas input manifold 670 channels process gases from the chamber gas feedthroughs into the constant voltage gradient gas feedthroughs, which are grounded. Gas feed tubes (not shown) deliver or route the process gases through the voltage gradient gas feedthroughs 672 and into the outlet manifold 674. Resistive sleeves surround the gas feed tubes to cause a linear voltage drop across the feedthrough preventing a plasma in the chamber from moving up the gas feed tubes. The gas feed tubes are preferably made of quartz and the sleeves are preferably made of a composite ceramic. The gas feed tubes are disposed within an isolating block which contains coolant channels to control temperature and prevent heat radiation and also to prevent liquefaction of process gases. Preferably, the insulating block is made of Delrin. The quartz feed tubes deliver gas into a gas output manifold 674 which channels the process gases to the blocker plate 644 and into the gas distribution plate 646.

The gas input manifold 670 (see FIG. 20) also defines a passage which delivers cleaning gases from a chamber gas feedthrough into the remote plasma source. These gases bypass the voltage gradient feedthroughs and are fed into a remote plasma source where the gases are activated into various excited species. The excited species are then delivered to the gas distribution plate at a point just below the blocker plate through a conduit disposed in gas inlet passage 640. The remote plasma source and delivery of reactant cleaning gases will be described in detail below.

The gas lines 639 which provide gas into the gas distribution systems of each processing region are preferably connected to a single gas source line and are therefore shared or commonly controlled for delivery of gas to each processing region 618, 620. The gas line(s) feeding the process gases to the multi-zone chamber are split to feed the multiple process regions by a t-type coupling. To facilitate flow into the individual lines feeding each process region, a filter, such as a sintered nickel filter available from PALL or Millipore, is disposed in the gas line upstream from the splitter. The filter enhances the even distribution and flow of gases into the separate gas feed lines.

The gas distribution system comprises a base plate having a blocker plate disposed adjacent to its lower surface. A face plate is disposed below the blocker plate to deliver the gases into the processing regions. In one embodiment, the base plate defines a gas passage therethrough to deliver process gases to a region just above the blocker plate. The blocker plate disperses the process gases over its upper surface and delivers the gases above the face plate. The holes in the blocker plate can be sized and positioned to enhance mixing of the process gases and distribution over the face plate. The gases delivered to the face plate are then delivered into the processing regions in a uniform manner over a wafer positioned for processing.

A gas feed tube is positioned in the gas passage and is connected at one end to an output line from a remote plasma source. One end of the gas feed tube extends through the gas outlet manifold to deliver gases from the remote plasma source. The other end of the gas feed tube is disposed through the blocker plate to deliver gases beyond the blocker plate to the region just above the face plate. The face plate disperses the gases delivered through the gas feed tube and then delivers the gases into the processing regions.

While this is a preferred gas distribution system, the gases from the remote plasma source can be introduced into the processing regions through a port provided through the chamber wall. In addition, process gases could be delivered through any gas distribution system which is presently available, such as the gas distribution system available from Applied Materials, Inc. of Santa Clara, Calif.

Heater Pedestal

FIG. 19 shows a heater pedestal 628 which is movably disposed in each processing region 618, 620 by a stem 626 which is connected to the underside of a support plate and extends through the bottom of the chamber body 602 where it is connected to a drive system 603. The stem 626 is preferably a circular, tubular, aluminum member, having an upper end disposed in supporting contact with the underside of the heater pedestal 628 and a lower end closed off with a cover plate. The lower end of the stem is received in a cup shaped sleeve, which forms the connection of the stem to the drive system. The stem 626 mechanically positions the heater pedestal 628 within the processing region and also forms an ambient passageway through which a plurality of heater plate connections can extend. Each heater pedestal 628 may include heating elements to heat a wafer positioned thereon to a desired process temperature. The heating elements may include for example a resistive heating element. Alternatively, the heater pedestal may be heated by an outside heating element such as a lamp. A pedestal used to advantage in the present invention is available from Applied Materials, Inc., of Santa Clara, Calif. The pedestal may also support an electrostatic chuck, a vacuum chuck or other chucking device to secure a wafer thereon during processing.

The drive system includes linear electric actuators made by Industrial Device Corporation located in Novabo, Calif. The heater assembly is raised and lowered by moving the transfer housing up or down to a process, clean, lift and release position. The transfer housing is connected to the actuator on one side and a linear slide on the other through a carriage plate. The connection between the actuator and the carriage is made via a flexible (ball and socket) joint to allow for any misalignment. The linear slide and carriage plate are biased against one another to prevent rotation and bending thereof. A bellows surrounds the stem of the heater and connects to the chamber bottom on one end and to the transfer housing on the other end. A seal ring is provided in a groove in the stem to seal the outer surface of the lower end of the stem in the sleeve. Leveling of the heater with respect to the faceplate is achieved with the use of three screws.

Alternatively, the drive system 603 includes a motor and reduction gearing assembly suspended below the chamber 106 and connected to a drive belt to a conformable coupling and lead screw assembly. A transfer housing is received on the lead screw assembly, which is guided up and down and held against rotation by a linear slide. The heater lift mechanism is held against the chamber with the drive collar. The heater assembly is raised and lowered by a lead screw which is driven by a stepper motor. The stepper motor is mounted to the heater lift assembly by a motor bracket. The stepper motor drives the lead screw in a bellows. The bellows turn the lead screw to raise or lower the heater assembly to the process, lift and release positions. A seal ring is provided in a groove in the stem to seal the outer surface of the lower end of the stem in the sleeve.

Wafer Positioning Assembly

The stem 626 moves upwardly and downwardly in the chamber to move the heater pedestal 628 to position a wafer thereon or remove a wafer therefrom for processing. A wafer positioning assembly includes a plurality of support pins 651 which move vertically with respect to the heater pedestal 628 and are received in bores 653 disposed vertically through the pedestal. Each pin 651 includes a cylindrical shaft 659 terminating in a lower spherical portion 661 and an upper truncated conical head 663 formed as an outward extension of the shaft. The bores 653 in the heater pedestal 628 include an upper, countersunk portion sized to receive the conical head 663 therein such that when the pin 651 is fully received into the heater pedestal 628, the head does not extend above the surface of the heater pedestal.

The lift pins 651 move partially in conjunction with, and partially independent of, the heater pedestal 628 as the pedestal moves within the processing region. The lift pins can extend above the pedestal 628 to allow the robot blade to remove the wafer from the processing region, but must also sink into the pedestal to locate the wafer on the upper surface of the pedestal for processing. To move the pins 651, the wafer positioning assembly includes an annular pin support 655 which is configured to engage lower spherical portions 661 of the lift pins 651 and a drive member which positions the pin support 655 to selectively engage the lift pins 651 depending on the position of the heater pedestal 628 within the processing region. The pin support 655, preferably made from ceramic, extends around the stem 626 below the heater pedestal 628 to selectively engage the lower spherical portions of the support pins.

A drive assembly lifts and lowers the shaft 630 and connected pin support 655 to move the pins 651 upwardly and downwardly in each processing region 618, 620. The pin drive member is preferably located on the bottom of the chamber 106 to control the movement of the pin support platform 655 with respect to the pedestal heater 628.

Vacuum System and Chamber Pumps

The vacuum control system for the processing system 100 of the present invention may include a plurality of vacuum pumps in communication with various regions of the system, with each region having its own setpoint pressure. However, the transfer of wafers from one chamber or region to another chamber or region requires the opening of slit valves which allow the environments of the communicating regions to mix somewhat and the pressures to equilibrate.

Figure 22A:
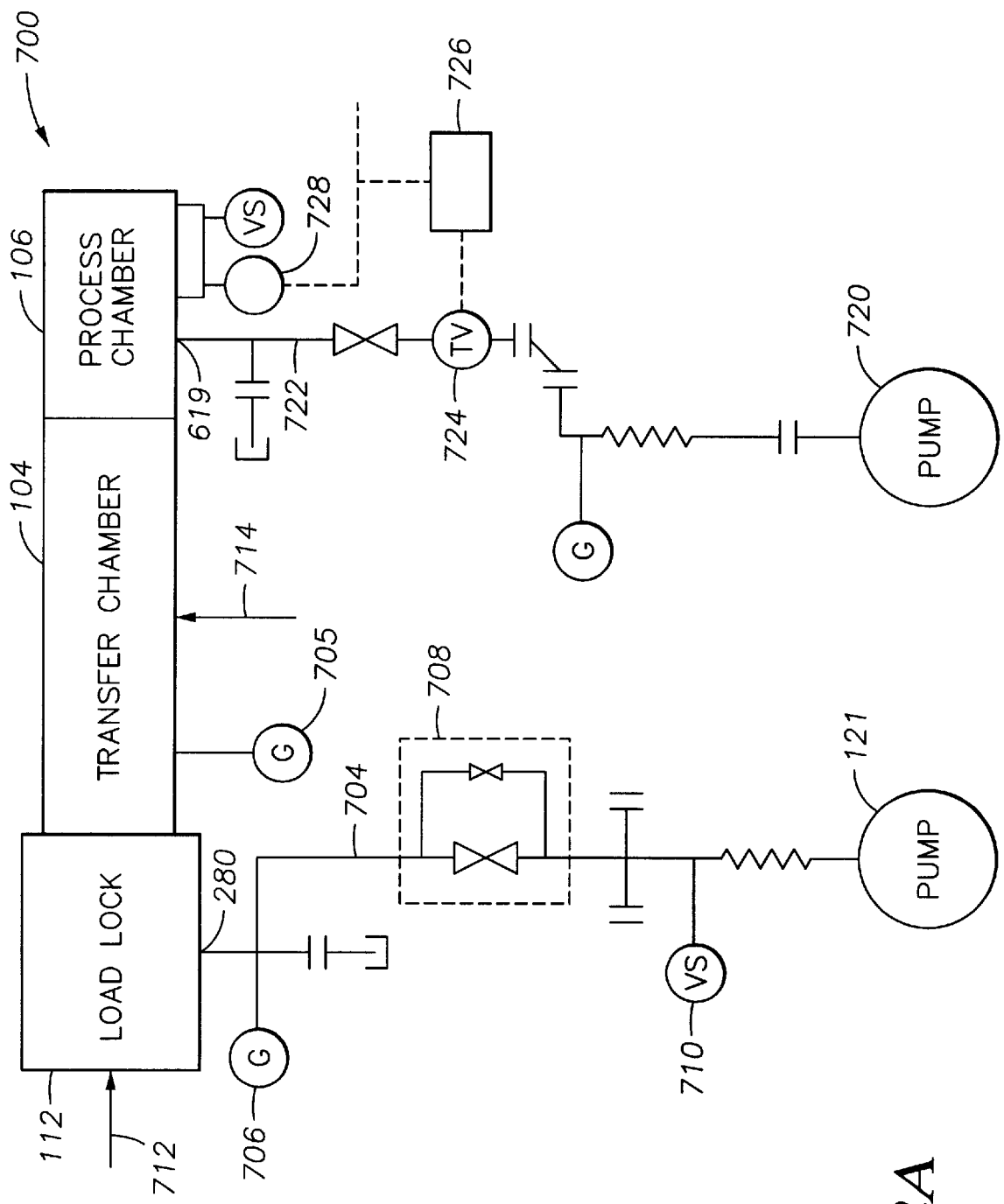
FIG. 22a is a schematic diagram of a vacuum system of the present invention.
Figure 22C:
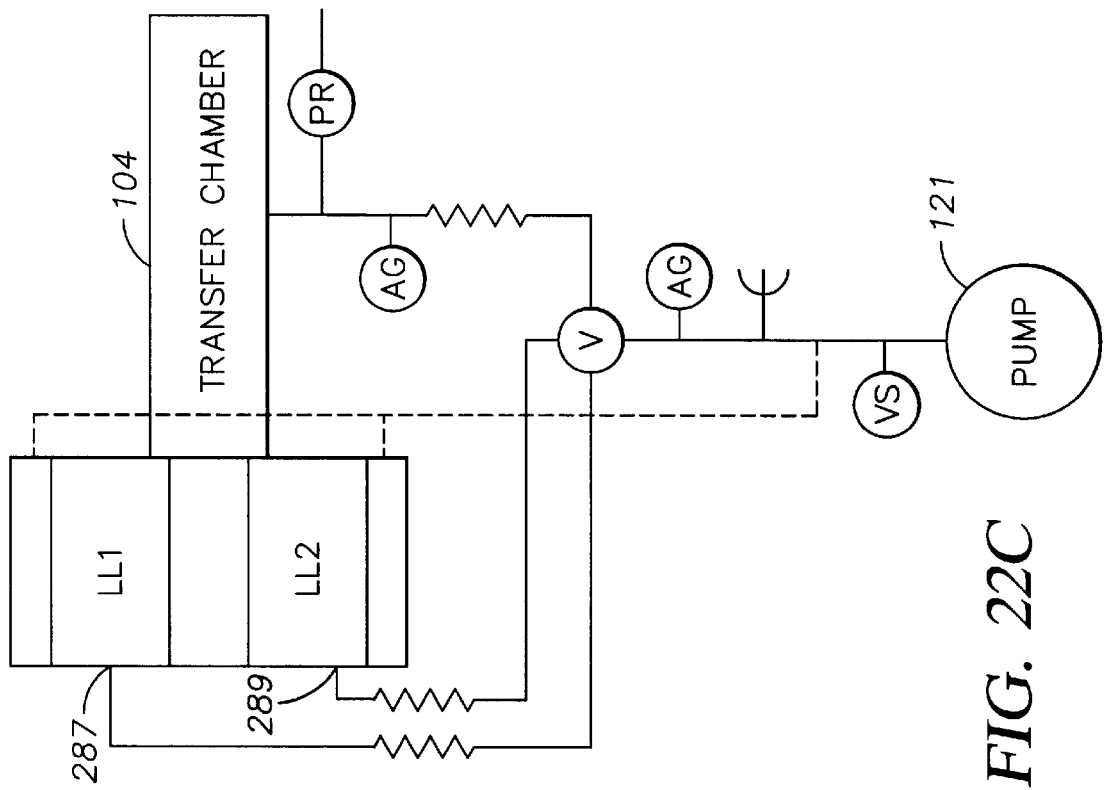
FIG. 22b is a schematic diagram of another vacuum system of the present invention.

FIG. 22a shows a schematic diagram of the vacuum system 700 of the present invention. The loadlock chamber 112 and the transfer chamber 104 preferably share a vacuum pump 121 mounted on the main frame 101 of the system adjacent the loadlock chamber and the transfer chamber. The loadlock chamber 112 is pumped down from atmosphere by pump 121 through exhaust port 280 disposed through the body of the loadlock chamber. The vacuum pressure in the transfer chamber 104, as indicated by pressure gauge 705, is provided by communication with the loadlock chamber 112 so that the pressure in the transfer chamber is always equal to or greater than the pressure in the loadlock chamber and any particles present in the loadlock chamber will not be drawn into the transfer chamber 104. Exhaust port 280 in loadlock chamber 112 is connected to pump 121 via exhaust line 704. A pressure gauge 706 is positioned along exhaust line 704 upstream from an isolation valve 708 to monitor the pressure in the loadlock chamber at any given time. Isolation valve 708 is located in exhaust line 704 between the pressure gauge 706 and the pump 121 to regulate the pressure in the loadlock chamber. A vacuum switch 710 is also provided in communication with the exhaust line between the isolation valve 708 and the pump 121. The pump 121 is preferably a roughing pump, but depending on the application may be any type of pump such as a turbomolecular pump, a cryogenic pump or the like. Gas vent lines 712, 714 are connected to the loadlock chamber 112 and the transfer chamber 104, respectively, to provide a vent gas, such as nitrogen, into these chambers.

Process chambers 106 are connected to a pump 720, such as a roughing pump, cryogenic pump or turbomolecular pump, via exhaust port 619 and exhaust line 722. A throttle valve 724, or the like, is located in the exhaust line to regulate the pressure in the processing regions 618, 620 of chambers 106 during operation. A valve controller 726, preferably a part of the system controller, provides a control signal to the throttle valve 724 based upon the pressure indicated by the vacuum gauge 728. Preferably, an exhaust port 619 is in communication with each processing region (shown in FIG. 21) and an exhaust line from each processing region tees into a single exhaust line 722 which is connected to the pump 720.

According to one aspect of the present invention, the slit valves in communication with the transfer chamber 104 and the vacuum controllers of each chamber 106 and the loadlock chamber 112 are operated in a manner that reduces the amount of contaminants entering the transfer chamber from either the loadlock chamber or any of the chambers 106. The invention requires the pressure in the loadlock chamber to be greater than or equal to, preferably greater than, the pressure in an adjacent chamber or region prior to opening the slit valve that will provide communication therebetween. The loadlock pressure should only be greater than atmospheric when open to the front end. The pressure should be lower than the transfer chamber pressure when opening to transfer in vacuum. It is particularly important that the transfer chamber 104 be at a high relative pressure when placed in communication with a process chamber, because the contaminant levels can be particularly great. For example, where the setpoint pressure in a processing chamber 106 is about $10^{-3}$ torr, the pressure in the transfer chamber should be greater than or equal to $10^{-3}$ torr, most preferably greater than about $10^{-2}$ torr, before opening the slit valves to transfer wafers into or out of the chamber 106.

The pressure in the transfer chamber is controlled in two ways. First, the vacuum in the transfer chamber is established by opening the slit valve(s) between the loadlock chamber 112 and the transfer chamber 104 and then pulling a vacuum in the loadlock chamber 112. In this manner, the pressure in the transfer chamber should never be lower than the pressure in the loadlock chamber and the only gas flow therebetween should be from the transfer chamber to the loadlock chamber 112. It is anticipated that so long as the transfer chamber is not in communication with any processing chambers, the slit valves between the transfer chamber and the loadlock chamber may remain open. Second, the transfer chamber is provided with a purge gas inlet, such as from an argon or nitrogen source. The purge gas may be delivered to the transfer chamber continuously or only as needed to provide a sufficient high pressure to cause a positive gas flow out of the transfer chamber.

In a particularly preferred mode, the slit valves to the loadlock chamber 112 should always be closed during wafer transfer between the transfer chamber 104 and a processing chamber 106, in order to avoid the possibility of drawing the pressure in the transfer chamber down below the pressure in the processing chamber. This condition could result in a multitude of contaminants from the processing chamber entering the transfer chamber and even the loadlock, thereby exposing an entire cassette of wafers.

Figure 22B:
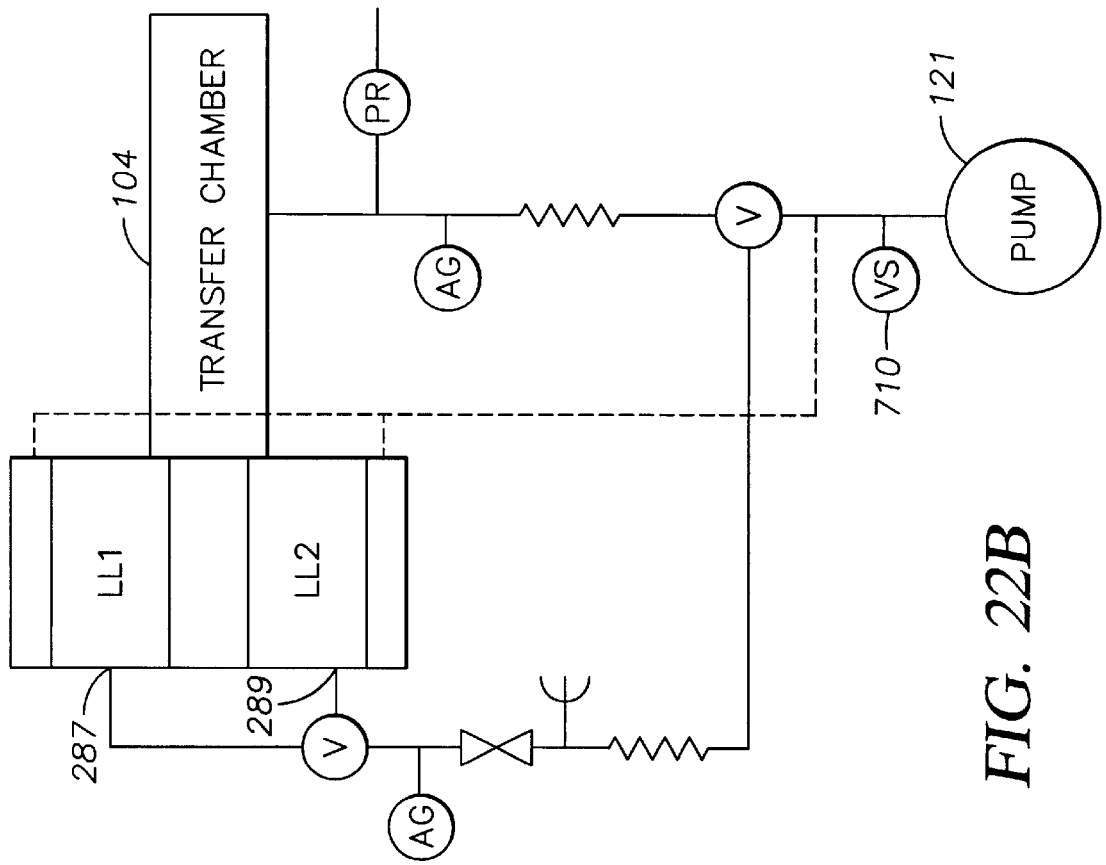

FIG. 22b shows a schematic diagram of two pumping systems used to advantage with the dual chamber loadlock described above. As can be seen from the figure, the two compartments can be pumped down together or selectively pumped down to a desired vacuum.

Gas Box and Supply

Outside of the chamber on the back end of the system, there is a gas supply panel containing the gases that are to be used during deposition and cleaning. The particular gases that are used depend upon the materials to be deposited onto the wafer or removed from the chamber. The process gases flow through an inlet port into the gas manifold and then into the chamber through a shower head type gas distribution assembly. An electronically operated valve and flow control mechanism control the flow of gases from the gas supply into the chamber.

In one embodiment of the invention the precursor gases are delivered from the gas box to the chamber where the gas line tees into two separate gas lines which feed gases through the chamber body as described above. Depending on the process, any number of gases can be delivered in this manner and can be mixed either before they are delivered to the bottom of the chamber or once they have entered the gas distribution plate.

Power Supplies

An advanced compact RF ("CRF") power delivery system is used for each processing region 618, 620 with one system connected to each gas distribution system. A 13.56 MHz RF generator, Genisis Series, manufactured by ENI, is mounted on the back end of the system for each chamber. This high frequency generator is designed for use with a fixed match and regulates the power delivered to the load, eliminating the concern about forward and reflected power. Up to 1250 watts may be supplied into load impedances with a VSWR of less than or equal to 1:5. To interface a high frequency RF generator and a low frequency RF generator to a process chamber, a low pass filter is designed into the fixed match enclosure.

A 350 kHz RF generator manufactured by ENI, is located in an RF generator rack on the back end of the system and linked to the fixed RF match by coaxial cable. The low frequency RF generator provides both low frequency generation and fixed match elements in one compact enclosure. The low frequency RF generator regulates the power delivered to the load reducing the concern about forward and reflected power.

Remote Clean Module

Figure 23:
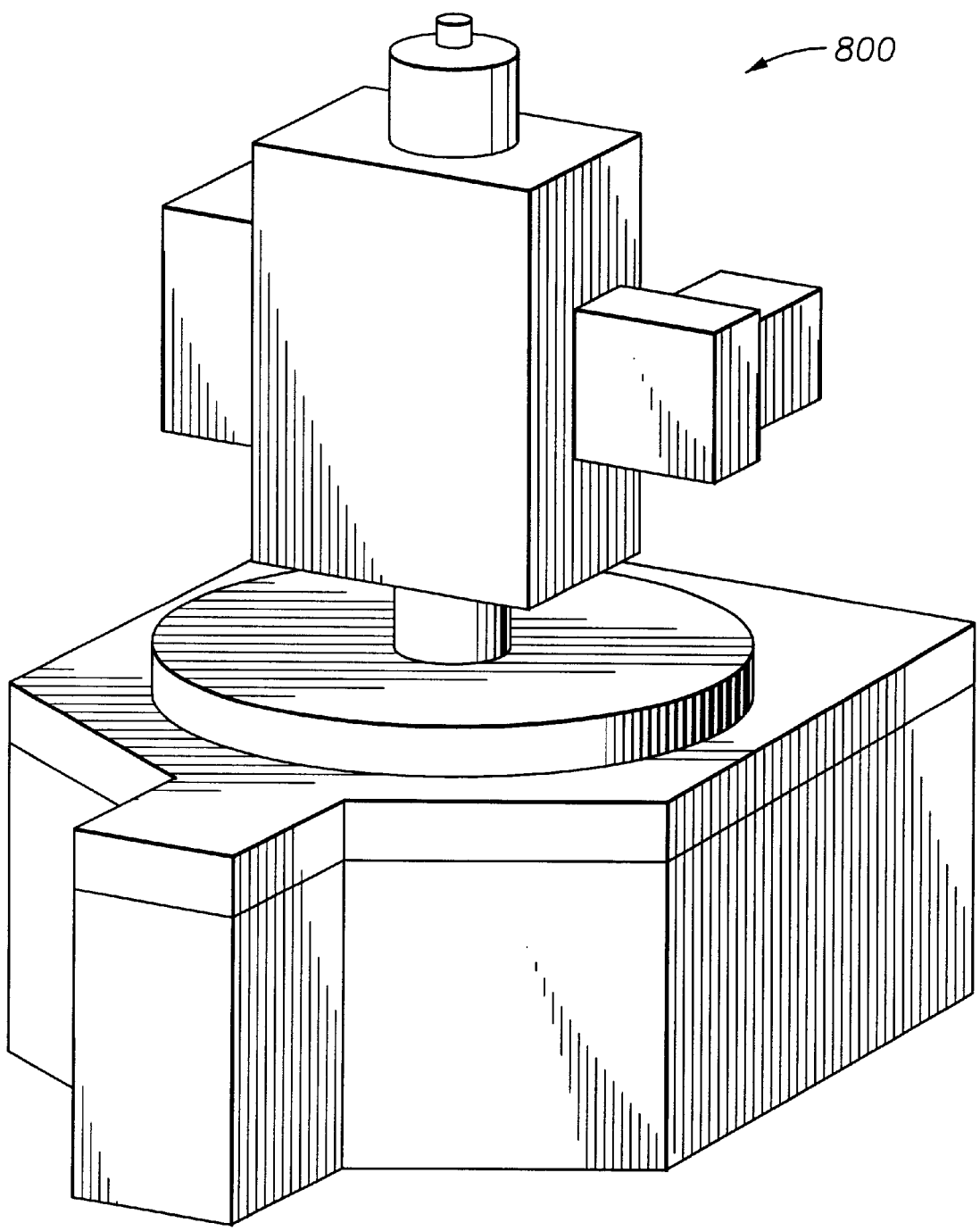
FIG. 23 is a perspective view of a remote plasma chamber mounted on a processing chamber.
Figure 24:
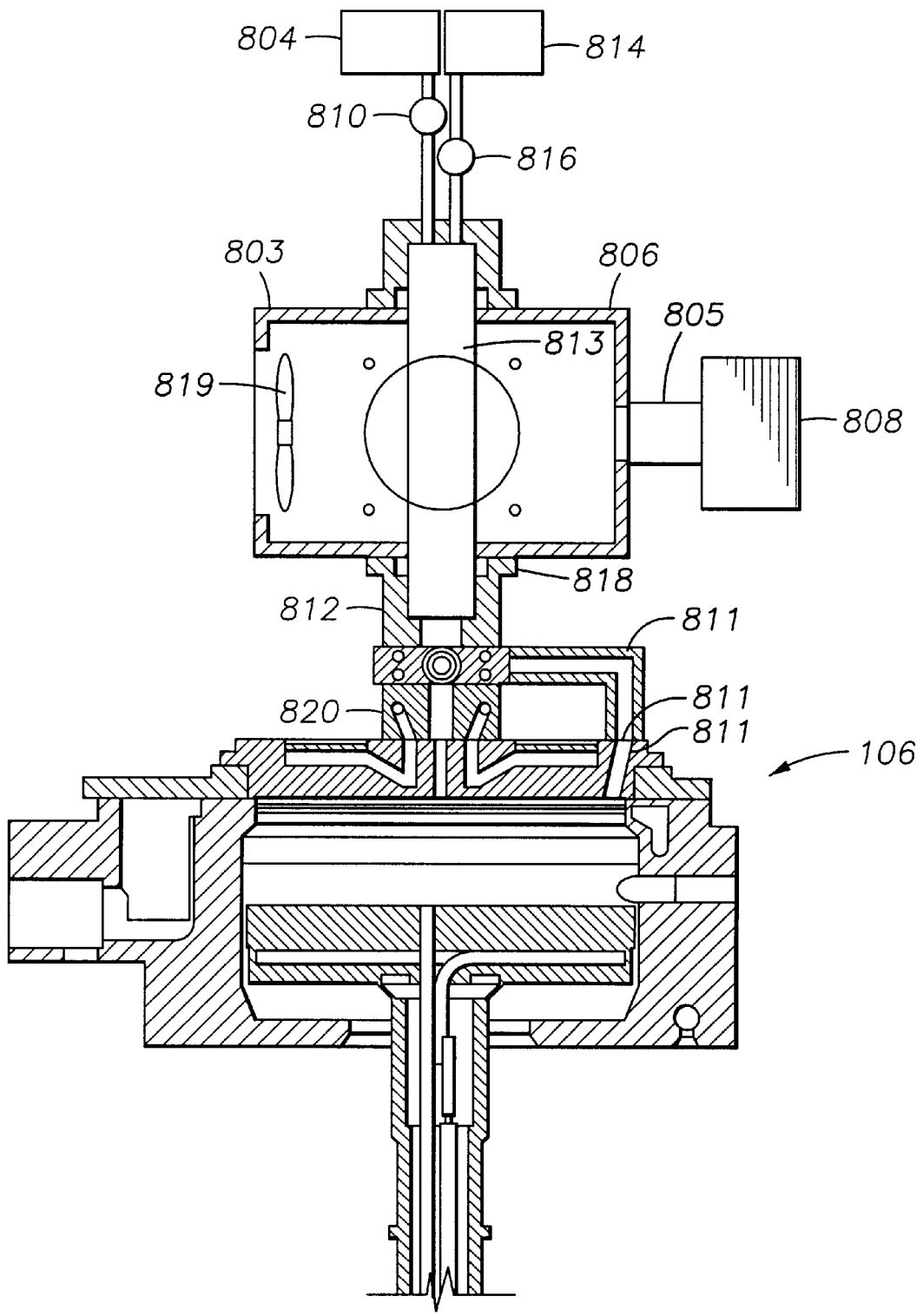
FIG. 24 is a cross sectional view of a remote plasma chamber mounted on a processing chamber.

FIGS. 23 and 24 show a perspective and cross sectional view of a remote clean module 800 of the present invention. In accordance with the invention, the remote clean module 800 is connected to the processing regions 618, 620 of chamber 106 through the inlet port 820. The remote clean module 800 supplies gas that is used to remove deposited material from the interior surfaces of the chamber after a sequence of process runs.

The remote clean module 800 includes a source of a precursor gas 804, a remote activation chamber 806 which is located outside of the processing chamber 106, a fan 819 disposed in the remote activation chamber 806, a power source 808 for activating the precursor gas within the remote activation chamber, an electronically operated valve and flow control mechanism 810, and a conduit or pipe 812 connecting the remote chamber to the processing chamber via a conduit 811. The valve and flow control mechanism 810 delivers gas from the source of precursor gas 804 into the remote activation chamber 806 at a user-selected flow rate. The activation chamber 806 includes an aluminum enclosure 803 having a gas feed tube 813 disposed therethrough. The power source 808 generates microwaves which are guided by a wave guide 805 into the enclosure 803. The tube 813 is transparent to microwaves so that the microwaves penetrate the tube and activate the precursor gas to form a reactive species which is then flowed through the conduit 812 into the gas distribution assembly and then into a processing chamber. In other words, the upper electrode or shower head 608 is used to deliver the reactive gas into the processing regions of the chamber. In the described embodiment, the remote chamber is a ceramic tube and the power source is a 2.54 GHz microwave generator with its output aimed at the ceramic tube.

Optionally, there may also be a source of a minor carrier gas 814 that is connected to the remote activation chamber through another valve and flow control mechanism 816. The minor carrier gas aids in the transport of the activated species to the deposition chamber. The gas can be any appropriate nonreactive gas that is compatible with the particular cleaning process with which it is being used. For example, the minor carrier gas may be argon, nitrogen, helium, hydrogen, or oxygen, etc. In addition to aiding in the transport of activated species to the deposition chamber, the carrier gas may also assist in the cleaning process or help initiate and/or stabilize the plasma in the deposition chamber.

In the described embodiment, there is a filter 818 in the conduit or pipe through which the activated species passes before entering the deposition chamber. The filter removes particulate matter that might have been formed during the activation of the reactive species. In the described embodiment, the filter is made of ceramic material having a pore size of about 0.01 to about 0.03 microns. Of course, other materials can also be used, for example, Teflon.

It should be noted that the filter can also be used to remove unwanted materials that might have been produced as byproducts of the reaction within the remote chamber. For example, if the reactive gas is $CF_4$ or $SF_6$, or some other halogen compound containing either carbon or sulfur, an activated carbon or sulfur species will be present as a byproduct of the activation process. It is generally desired, however, that carbon and sulfur not be present in the deposition chamber. This is why these compounds are generally not used in conventional dry cleaning processes where the activation occurs entirely within the deposition chamber. However, when the activation is performed remotely, as described herein, these materials can be easily removed by using an appropriate filter material. Such filter materials are readily available in the commercial market and are well-known to persons of ordinary skill in the art.

In the described embodiment, the precursor is $NF_3$. The flow rate of activated species is about 0.5 liters to about 2 liters per minute and the chamber pressure is about 0.5 to about 2.5 Torr. To activate the precursor gas, the microwave source delivers about 500 to about 1500 Watts to the activation chamber. Within the deposition chamber, the RF sources supply about 100 to about 200 Watts to the plasma. For the present system, this implies a voltage between the upper and lower electrodes of about 15 to about 20 volts. The precise voltage and current are pressure dependent, i.e., the current is proportional to the pressure given a fixed voltage. In any event, it is only necessary to induce a gentle plasma within the chamber, which only need be strong enough to sustain the activated species that has been flown into the chamber from the remote source.

By using $NF_3$ as the feed gas, chambers that have been deposited with silicon (Si), doped silicon, silicon nitride ($Si_3N_{+4}$) and silicon oxide ($SiO_2$) can be cleaned. The cleaning rate for deposited film is about 2 microns/minute for silicon nitride and about 1 micron/minute for silicon, doped silicon, and silicon oxide. These cleaning rates are two to four times faster than the conventional cleaning process which employs only a local plasma with a power level of about 1 to about 2 kilowatts at 13.56 MHz RF.

Though a microwave generator is used in the described embodiment to activate the precursor gas, any power source that is capable of activating the precursor gas can be used. For example, both the remote and local plasmas can employ DC, radio frequency (RF), and microwave (MW) based discharge techniques. In addition, if an RF power source is used, it can be either capacitively or inductively coupled to the inside of the chamber. The activation can also be performed by a thermally based, gas break-down technique, a high intensity light source, or an x-ray source, to name just a few.

In general, the reactive gases may be selected from a wide range of options, including the commonly used halogens and halogen compounds. For example, the reactive gas may be chlorine, fluorine or compounds thereof, e.g. $NF_3$, $CF_4$, $SF_6$, $C_2F_6$, $CCl_4$, $C_2Cl_6$. Of course, the particular gas that is used depends on the deposited material which is being removed. For example, in a tungsten deposition system, a fluorine compound gas is typically used to etch and/or remove the deposited tungsten.

Because of the use of a local plasma in conjunction with the remote plasma, the remote activation chamber can be placed farther away from the chamber. Thus, only tubing is needed to connect the two remote sources to the local source. Some quenching of the activated species (i.e., deactivation of the activated species) may occur during the transfer. However, the local source compensates for any such quenching that may occur. In fact, some long lived activated species (e.g. F*) typically do not return to the ground state when quenched, but rather they transition to an intermediate state. Thus, the amount of energy that is required to reactivate the quenched species is much less than is required to activate the gas in the remote activation chamber. Consequently, the local activation source (e.g., plasma) need not be a high energy source.

It should also be noted that by placing the remote source at a distance from the deposition chamber, the short lived radicals that are produced during the activation process will be quenched more completely than the long lived radicals as both are transferred to the deposition chamber. Thus, the reactive gas that flows into the deposition chamber will contain primarily the long lived radicals that have survived the transfer. For example, if $NF_3$ is the reactive gas, two radicals are produced in the remote activation chamber, namely, N* and F*. The nitrogen radical is short lived and the fluorine radical is long lived. The nitrogen radical will typically not survive a long transfer from the remote chamber to the deposition chamber, whereas a large percentage of the fluorine radicals will survive. This is a form of natural filtering that occurs in the system that may be very desirable. In the case of nitrogen radicals, for example, it is sometimes preferable that they not be present in the deposition chamber because their presence may result in the formation of $N_xH_yF_z$ compounds, which can harm the pump. When the activation is performed in the deposition chamber, however, as in the case of conventional cleaning techniques, there is no easy way to eliminate the nitrogen radicals that are produced.

In the dry cleaning process, chamber pressure can be selected to lie anywhere within a fairly broad range of values without significantly affecting performance. The preferred pressure range is from about 0.1 to about 2 Torr, although pressures outside of that range can also be used. In addition, the frequencies that were chosen for the described embodiment were merely illustrative and the frequencies that may be used in the invention are not restricted to those used in the described embodiment. For example, with regard to the RF power source, any of a wide range of frequencies (e.g., 400 KHz to 13.56 MHz) are typically used to generate plasmas and those frequencies may also be used in the invention. In general, however, it should be understood that the power levels, flow rates, and pressure that are chosen are system specific and thus the will need to be optimized for the particular system in which the process is being run. Making the appropriate adjustments in process conditions to achieve optimum of performance for a particular system is well within the capabilities of a person of ordinary skill in the art.

Programming

The system controller operates under the control of a computer program stored on the hard disk drive of a computer. The computer program dictates the process sequencing and timing, mixture of gases, chamber pressures, RF power levels, susceptor positioning, slit valve opening and closing, wafer heating and other parameters of a particular process. The interface between a user and the system controller is preferably via a CRT monitor and lightpen which is depicted in FIG. 8. In a preferred embodiment two monitors are used, one monitor mounted in the clean room wall for the operators and the other monitor behind the wall for the service technicians. Both monitors simultaneously display the same information but only one lightpen is enabled. The lightpen detects light emitted by the CRT display with a light sensor in the tip of the pen. To select a particular screen or function, the operator touches a designated area of the display screen and pushes the button on the pen. The display screen generally confirms communication between the lightpen and the touched area by changing its appearance, i.e. highlight or color, or displaying a new menu or screen.

A variety of processes can be implemented using a computer program product that runs on, for example, the system controller. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled library routines. To execute the linked compiled object code, the system user invokes the object code, causing the computer system to load the code in memory, from which the CPU reads and executes the code to perform the tasks identified in the program.

Figure 25:
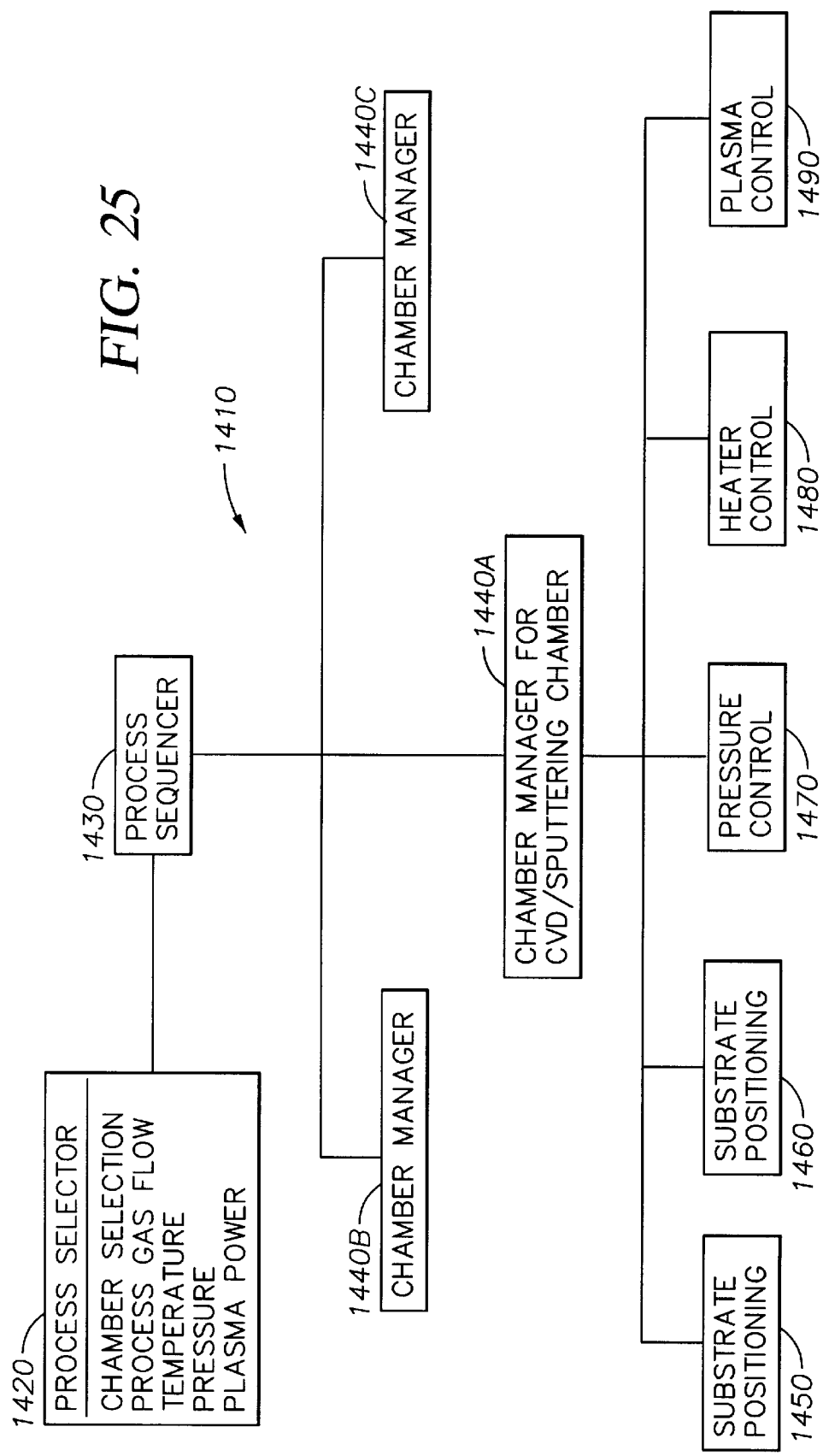
FIG. 25 is an illustrative block diagram of the hierarchical control structure of a computer program for process control.

FIG. 25 shows an illustrative block diagram of a preferred hierarchical control structure of the computer program 1410. A user enters a process set number and process chamber number into a process selector subroutine 1420 in response to menus or screens displayed on the CRT monitor by using the lightpen interface. The process sets provide predetermined sets of process parameters necessary to carry out specified processes, and are identified by predefined set numbers. The process selector subroutine 1420 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered in any conventional manner, but most preferably by utilizing the lightpen/CRT monitor interface.

Electronic signals provided by various instruments and devices for monitoring the process are provided to the computer through the analog input and digital input boards of the system controller. Any conventional method of monitoring the process chambers can be used, such as polling. Furthermore, electronic signals for operating various process controllers or devices are output through the analog output and digital output boards of the system controller. The quantity, type and installation of these monitoring and controlling devices may vary from one system to the next according to the particular end use of the system and the degree of process control desired. The specification or selection of particular devices, such as the optimal type of thermocouple for a particular application, is known by persons with skill in the art.

A process sequencer subroutine 1430 comprises program code for accepting the identified process chamber number and set of process parameters from the process selector subroutine 1420, and for controlling operation of the various process chambers. Multiple users can enter process set numbers and process chamber numbers, or a user can enter multiple process chamber numbers, so the sequencer subroutine 1430 operates to schedule the selected processes in the desired sequence. Preferably, the process sequencer subroutine 1430 includes program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. When scheduling which process is to be executed, the sequencer subroutine 1430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 1430 determines which process chamber and process set combination is going to be executed next, the sequencer subroutine 1430 causes execution of the process set by passing the particular process set parameters to a chamber manager subroutine 1440a–c which controls multiple processing tasks in a process chamber 106 according to the process set determined by the sequencer subroutine 1430. For example, the chamber manager subroutine 1440a comprises program code for controlling sputtering and CVD process operations in the process chamber 106. The chamber manager subroutine 1440 also controls execution of various chamber component subroutines which control operation of the chamber component necessary to carry out the selected process set. Examples of chamber component subroutines are wafer positioning subroutine 1450, process gas control subroutine 1460, pressure control subroutine 1470, heater control subroutine 1480, and plasma control subroutine 1490. Those having ordinary skill in the art will recognize that other chamber control subroutines can be included depending on what processes are desired to be performed in the process chamber 106. In operation, the chamber manager subroutine 1440a selectively schedules or calls the process component subroutines in accordance with the particular process set being executed. The chamber manager subroutine 1440a schedules the process component subroutines similarly to how the sequencer subroutine 1430 schedules which process chamber 106 and process set is to be executed next. Typically, the chamber manager subroutine 1440a includes steps of monitoring the various chamber components, determining which components need to be operated based on the process parameters for the process set to be executed, and causing execution of a chamber component subroutine responsive to the monitoring and determining steps.

Operation of particular chamber components subroutines will now be described with reference to FIG. 25. The wafer positioning subroutine 1450 comprises program code for controlling chamber components that are used to load the wafer onto the pedestal 628, and optionally to lift the wafer to a desired height in the chamber 106 to control the spacing between the wafer and the showerhead 642. When wafers are loaded into the chamber 106, the pedestal 628 is lowered and the lift pin assembly is raised to receive the wafer and, thereafter, the pedestal 628 is raised to the desired height in the chamber, for example to maintain the wafer at a first distance or spacing from the gas distribution manifold during the CVD process. In operation, the wafer positioning subroutine 1450 controls movement of the lift assembly and pedestal 628 in response to process set parameters related to the support height that are transferred from the chamber manager subroutine 1440a.

The process gas control subroutine 1460 has program code for controlling process gas composition and flow rates. The process gas control subroutine 1460 controls the open/close position of the safety shut-off valves, and also ramps up/down the mass flow controllers to obtain a desired gas flow rate. The process gas control subroutine 1460 is invoked by the chamber manager subroutine 1440a, as are all chamber components subroutines, and receives from the chamber manager subroutine process parameters related to the desired gas flow rate. Typically, the process gas control subroutine 1460 operates by opening a single control valve between the gas source and the chamber 106 gas supply lines, and repeatedly (i) measuring the mass flow rate, (ii) comparing the actual flow rate to the desired flow rate received from the chamber manager subroutine 1440a, and (iii) adjusting the flow rate of the main gas supply line as necessary. Furthermore, the process gas control subroutine 1460 includes steps for monitoring the gas flow rate for an unsafe rate, and activating a safety shut-off valve when an unsafe condition is detected.

In some processes, an inert gas such as argon is provided into the chamber 106 to stabilize the pressure in the chamber before reactive process gases are introduced into the chamber. For these processes, the process gas control subroutine 1460 is programmed to include steps for flowing the inert gas into the chamber 106 for an amount of time necessary to stabilize the pressure in the chamber, and then the steps described above would be carried out. Additionally, when a process gas is to be vaporized from a liquid precursor, for example tetraethylorthosilane (TEOS), the process control subroutine 1460 would be written to include steps for bubbling a delivery gas such as helium through the liquid precursor in a bubbler assembly. For this type of process, the process gas control subroutine 1460 regulates the flow of the delivery gas, the pressure in the bubbler, and the bubbler temperature in order to obtain the desired process gas flow rates. As discussed above, the desired process gas flow rates are transferred to the process gas control subroutine 1460 as process parameters. Furthermore, the process gas control subroutine 1460 includes steps for obtaining the necessary delivery gas flow rate, bubbler pressure, and bubbler temperature for the desired process gas flow rate by accessing a stored data table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 1470 comprises program code for controlling the pressure in the chamber 106 by regulating the size of the opening of the throttle valve in the exhaust system of the chamber. The size of the opening of the throttle valve is varied to control the chamber pressure at a desired level in relation to the total process gas flow, the gas-containing volume of the process chamber, and the pumping set point pressure for the exhaust system. When the pressure control subroutine 1470 is invoked, the desired set point pressure level is received as a parameter from the chamber manager subroutine 1440a. The pressure control subroutine 1470 operates to measure the pressure in the chamber 106 using one or more conventional pressure manometers connected to the chamber, compare the measured value(s) to the set point pressure, obtain PID (proportional, integral, and differential) control parameters from a stored pressure table corresponding to the set point pressure, and adjust the throttle valve according to the PID values obtained from the pressure table. Alternatively, the pressure control subroutine 1470 can be written to open or close the throttle valve to a particular opening size to regulate the chamber 106 to the desired pressure.

The heater control subroutine 1480 comprises program code for controlling the temperature of the lamp or heater module that is used to heat the wafer 502. The heater control subroutine 1480 is also invoked by the chamber manager subroutine 1440a and receives a desired, or set point, temperature parameter. The heater control subroutine 1480 determines the temperature by measuring voltage output of a thermocouple located in a pedestal 628, compares the measured temperature to the set point temperature, and increases or decreases current applied to the heater to obtain the set point temperature. The temperature is obtained from the measured voltage by looking up the corresponding temperature in a stored conversion table, or by calculating the temperature using a fourth order polynominal. When radiant lamps are used to heat the pedestal 628, the heater control subroutine 1480 gradually controls a ramp up/down of current applied to the lamp. The gradual ramp up/down increases the life and reliability of the lamp. Additionally, a built-in-fail-safe mode can be included to detect process safety compliance, and can shut down operation of the lamp or heater module if the process chamber 106 is not properly set up.

The plasma control subroutine 1490 comprises program code for setting the RF bias voltage power level applied to the process electrodes in the chamber 106, and optionally, to set the level of the magnetic field generated in the chamber. Similar to the previously described chamber component subroutines, the plasma control subroutine 1490 is invoked by the chamber manager subroutine 1440a.

While the system of the present invention was described above with reference to a plasma enhanced CVD application, it is to be understood that the invention also includes the use of high density (HDP) CVD and PVD chambers as well as etch chambers. For example, the system of the present invention can be adapted to include tandem HDP CVD chambers for plasma processing. In one alternative embodiment, the gas distribution/lid assembly could be replaced with a dielectric dome having an inductive coil disposed about the dome and an RF power supply connected to the coil to enable inductive coupling of a high density plasma within the chamber. Similarly, tandem PVD chambers could be configured with a target assembly disposed thereon for a deposition material source. DC power supplies could be connected the target assemblies to provide sputtering power thereto.

While the foregoing is directed to the preferred embodiment of the present invention, other and further embodiments of the invention may be devised without departing from the basic scope thereof The scope of the invention is determined by the claims which follow.

What is claimed is:

1. A processing apparatus, comprising:
   (a) a chamber having a plurality of isolated processing regions formed therein;
   (b) a gas distribution assembly disposed in each processing region;
   (c) a gas source connected to the plurality of isolated processing regions;
   (d) a power supply connected to each gas distribution assembly.

2. The apparatus of claim 1 further comprising a wafer pedestal disposed in each isolated processing region.

3. The apparatus of claim 2 further comprising a pumping channel disposed in each isolated processing region.

4. The apparatus of claim 3 further comprising an exhaust port connected to the pumping channel of each isolatable processing region.

5. The apparatus of claim 3 wherein a single exhaust port is connected to the pumping channel in each processing region.

6. The apparatus of claim 5 further comprising a pump connected to the exhaust port.

7. The apparatus of claim 6 wherein each wafer pedestal includes a heating member disposed therein.

8. The apparatus of claim 7 wherein the heating member is a resistive heating element.

9. The apparatus of claim 7 wherein the heating member is a lamp.

10. The apparatus of claim 8 wherein each isolated processing region further comprises a chamber liner disposed therein.

11. The apparatus of claim 10 wherein the chamber liner is comprised of a ceramic.

12. The apparatus of claim 10 wherein the chamber liner includes a plurality of exhaust channels disposed therethrough to connect the processing region and the pumping channel.

13. The apparatus of claim 1 further comprising a remote plasma system connected to each isolated processing region.

14. The apparatus of claim 13 wherein the remote plasma system comprises:
   (a) a chamber;
   (b) a gas tube having an inlet and an outlet disposed in the chamber; and
   (c) a power source connected to the chamber.

15. The apparatus of claim 14 further comprising a fan disposed in the chamber.

16. The apparatus of claim 15 wherein the gas tube is comprised of a ceramic.

17. The apparatus of claim 16 wherein the gas tube is comprised of aluminum oxide.

18. The apparatus of claim 1 wherein each gas distribution assembly comprises:
   (a) a base plate;
   (b) a blocker plate disposed below the base plate;
   (c) a face plate disposed below the blocker plate;
   (d) one or more gas inlets to deliver one or more process gases to the blocker plate; and
   (e) one or more gas inlets to deliver one or more gases from the remote plasma source to the face plate.

19. The apparatus of claim 1 wherein each gas distribution assembly shares process gases from one or more gas sources.

20. The apparatus of claim 19 wherein each gas distribution assembly is connected to a power supply.

21. The apparatus of claim 20 wherein each gas distribution assembly is connected to a separate power supply.

22. The apparatus of claim 20 further comprising a wafer pedestal disposed in each processing region.

23. The apparatus of claim 22 wherein each wafer pedestal includes a heating member.

24. The apparatus of claim 23 wherein the heating member comprises a resistive heating element.

25. The apparatus of claim 23 wherein the heating member comprises a lamp.

26. The apparatus of claim 23 wherein each pedestal includes independent temperature control.

27. The apparatus of claim 20 further comprising a remote plasma system connected to each isolated processing region.

28. The apparatus of claim 27 wherein the remote plasma system comprises:
   (a) a chamber;
   (b) a gas tube disposed in the chamber; and
   (c) a power source connected to the chamber.

29. The apparatus of claim 28 wherein each gas distribution assembly comprises:
   (a) a base plate;
   (b) a blocker plate disposed below the base plate;
   (c) a face plate disposed below the blocker plate;
   (d) one or more gas inlets to deliver one or more process gases to the blocker plate; and
   (e) one or more gas inlets to deliver one or more gases from the remote plasma source to the face plate.

* * * * *